United States Patent
Han et al.

(10) Patent No.: US 12,395,191 B2
(45) Date of Patent: Aug. 19, 2025

(54) METHOD AND APPARATUS FOR DECODING POLARIZATION-ADJUSTED CONVOLUTIONAL CODE BY USING LIST VITERBI ALGORITHM ADJUSTING LIST SIZE DYNAMICALLY

(71) Applicant: Samsung Electronics Co., Ltd., Gyeonggi-do (KR)

(72) Inventors: Donghwa Han, Gyeonggi-do (KR); Seho Myung, Gyeonggi-do (KR); Kwonjong Lee, Gyeonggi-do (KR); Donghun Lee, Gyeonggi-do (KR); Min Jang, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 14 days.

(21) Appl. No.: 18/632,819

(22) Filed: Apr. 11, 2024

(65) Prior Publication Data

US 2024/0348366 A1   Oct. 17, 2024

(30) Foreign Application Priority Data

Apr. 13, 2023  (KR) .................. 10-2023-0048747
Aug. 31, 2023  (KR) .................. 10-2023-0115453

(51) Int. Cl.
 *H03M 13/23*    (2006.01)
 *H04L 1/00*     (2006.01)
 *H03M 13/41*    (2006.01)

(52) U.S. Cl.
 CPC ............ *H03M 13/23* (2013.01); *H04L 1/006* (2013.01); *H03M 13/41* (2013.01); *H04L 1/0054* (2013.01)

(58) Field of Classification Search
 CPC ... H04L 1/0054; H04L 1/0057; H04L 1/0059; H04L 1/0064; H03M 13/13;
 (Continued)

(56) References Cited

U.S. PATENT DOCUMENTS

2012/0036416 A1   2/2012   Wang et al.
2018/0278268 A1   9/2018   Jeong et al.
(Continued)

FOREIGN PATENT DOCUMENTS

CN       114430279     *   5/2022   ............ H03M 13/23
KR    10-2018-0108373        10/2018
(Continued)

OTHER PUBLICATIONS

Mozammel, Hardware implementation of Fano decoder for Polarization-Adjusted Convolutional (PAC) codes, IEEE Trans. on Circuits and Systems-II Express Briefs, vol. 69, No. 3, pp. 1632-1636. (Year: 2022).*

(Continued)

*Primary Examiner* — Shelly A Chase
(74) *Attorney, Agent, or Firm* — The Farrell Law Firm, P.C.

(57) ABSTRACT

The disclosure relates to fifth generation (5G) or sixth generation (6G) communication systems to support higher data rates. A receiver of a communication system includes a transceiver configured to receive a signal encoded based on polarization-adjusted convolutional (PAC) coding from a transmitter, and a controller configured to calculate branch metrics of branches defined in a trellis associated with the PAC, calculate a path metric based on an accumulated sum of the branch metrics, determine a path assigned to each state based on the path metric, and estimate a codeword based on the determined path, wherein a number of paths assigned to each state is dynamically determined according to the number of active states, and wherein the active state includes at least one branch.

20 Claims, 22 Drawing Sheets

(58) Field of Classification Search
CPC ............... H03M 13/23; H03M 13/256; H03M 13/2939; H03M 13/413; H03M 13/4115; H03M 13/4146
See application file for complete search history.

(56) References Cited

U.S. PATENT DOCUMENTS

| | | |
|---|---|---|
| 2021/0152186 A1 | 5/2021 | Jang et al. |
| 2021/0250052 A1 | 8/2021 | Kamiya |
| 2021/0367620 A1 | 11/2021 | Chaghooshi et al. |
| 2022/0103291 A1* | 3/2022 | Arikan ................. H04L 1/0064 |
| 2022/0337269 A1 | 10/2022 | Ma et al. |
| 2023/0179229 A1* | 6/2023 | Yao ....................... H03M 13/13 714/786 |

FOREIGN PATENT DOCUMENTS

| | | |
|---|---|---|
| KR | 10-2019-0016399 | 2/2019 |
| KR | 10-2334420 | 11/2021 |

OTHER PUBLICATIONS

Rowsham, List Viterbi Decoding of PAC codes, IEEE Trans. on Vehicular Tech., Vo. 70, No. 3, pp. 2428-2435 (Year: 2021).*
Rowshan, Mohammad et al., "List Viterbi Decoding of PAC Codes", IEEE Transactions on Vehicular Technology, vol. 70, No. 3, Mar. 2021, pp. 2428-2435.

* cited by examiner

FIG. 13

METHOD AND APPARATUS FOR DECODING POLARIZATION-ADJUSTED CONVOLUTIONAL CODE BY USING LIST VITERBI ALGORITHM ADJUSTING LIST SIZE DYNAMICALLY

CROSS-REFERENCE TO RELATED APPLICATIONS

This application is based on and claims priority under 35 U.S.C. § 119 to Korean Patent Application Nos. 10-2023-0048747 and 10-2023-0115453, which were filed on Apr. 13, 2023, and Aug. 31, 2023, respectively, in the Korean Intellectual Property Office, the disclosures of which are incorporated herein by reference in their entireties.

BACKGROUND

1. Field

The disclosure relates generally to a wireless communication system and, more particularly, to a method and an apparatus for decoding a polarization-adjusted convolutional (PAC) code by using a list Viterbi algorithm (LVA) that dynamically adjusts the list size.

2. Description of Related Art

Fifth generation (5G) mobile communication technologies define broad frequency bands such that high transmission rates and new services are possible, and can be implemented not only in sub 6 gigahertz (GHz) bands such as 3.5 GHz, but also in above 6 GHz bands referred to as millimeter wave (mmWave) bands including 28 GHz and 39 GHz. In addition, it has been considered to implement Sixth generation (6G) mobile communication technologies, referred to as beyond 5G systems, in terahertz (THz) bands (for example, 95 GHz to 3 THz bands) to achieve transmission rates fifty times faster than 5G mobile communication technologies and ultra-low latencies one-tenth of 5G mobile communication technologies.

Since the early stages of 5G mobile communication technologies, to support services and to satisfy performance requirements in connection with enhanced mobile broadband (eMBB), ultra reliable & low latency communications (URLLC), and massive machine-type communications (mMTC), there has been ongoing standardization regarding beamforming and massive MIMO for alleviating radio-wave path loss and increasing radio-wave transmission distances in mmWave, numerology, such as operating multiple sub-carrier spacings, for efficiently utilizing mmWave resources and dynamic operation of slot formats, initial access technologies for supporting multi-beam transmission and broad-bands, definition and operation of bandwidth part (BWP), new channel coding methods such as a low density parity check (LDPC) code for large-capacity data transmission and a polar code for highly reliable transmission of control information, layer 2 (L2) pre-processing, and network slicing for providing a dedicated network customized to a specific service.

eMBB aims at providing a data rate higher than that supported by existing long term evolution (LTE), LTE-advanced (LTE-A), or LTE-Pro. For example, in the 5G communication system, eMBB must provide a peak data rate of 20 gigabits per second (Gbps) in the downlink and a peak data rate of 10 Gbps in the uplink for a single base station. The 5G communication system must provide an increased user-perceived data rate to UEs, as well as the maximum data rate. To satisfy such requirements, various transmission/reception technologies including a further enhanced MIMO transmission technique needs to be improved. In the LTE system, signals are transmitted using a transmission bandwidth up to 20 megahertz (MHz) in a band of 2 GHz, and the data rate required for the 5G communication system may be obtained using a frequency bandwidth more than 20 MHz in a frequency band of 3 to 6 GHz or 6 GHz or more.

mMTC is being considered to support application services such as the Internet of Things (IoT) in the 5G communication system. mMTC has requirements, such as support of connection of a large number of UEs in a cell, enhancement coverage of UEs, improved battery time, a reduction in the cost of a UE, and the like, to effectively provide the IoT. Since the IoT provides communication functions while being provided to various sensors and various devices, many UEs (e.g., 1,000,000 UEs/km2) must be supported in a cell. In addition, a UE supporting mMTC requires wider coverage than those of other services provided by the 5G communication system since the UE is likely to be located in a shadow area, such as a basement of a building, which is not covered by the cell due to the nature of the service. The UE supporting mMTC must be configured to be inexpensive, and requires a very long battery life-time, such as 10 to 16 years, since it is difficult to frequently replace the battery of the UE.

URLLC is a cellular-based mission-critical wireless communication service that may be used for remote control for robots or machines, industrial automation, unmanned aerial vehicles, remote health care, emergency alert, and the like. Thus, URLLC must provide communication with ultra-low latency and ultra-high reliability. For example, a service supporting URLLC must satisfy an air interface latency of less than 0.5 milliseconds (ms), and also requires a packet error rate of 10-5 or less. Therefore, for the services supporting URLLC, the 5G system must provide a transmit time interval (TTI) shorter than those of other services and must assign a large number of resources in a frequency band to secure reliability of a communication link.

Data traffic in the eMBB, URLLC, and mMTC services may be multiplexed and then transmitted in the corresponding system. In this case, different transmission/reception techniques and transmission/reception parameters may be used between services to satisfy different requirements of the respective services.

Currently, there are ongoing discussions regarding improvement and performance enhancement of initial 5G mobile communication technologies in view of services to be supported by 5G mobile communication technologies, and there has been physical layer standardization regarding technologies such as vehicle-to-everything (V2X) for aiding driving determination by autonomous vehicles based on information regarding positions and states of vehicles transmitted by the vehicles and for enhancing user convenience, new radio unlicensed (NR-U) aimed at system operations conforming to various regulation-related requirements in unlicensed bands, NR UE power saving, non-terrestrial network (NTN) which is UE-satellite direct communication for securing coverage in an area in which communication with terrestrial networks is unavailable, and positioning.

There is also ongoing standardization in wireless interface architecture/protocol fields regarding technologies such as industrial Internet of things (IIoT) for supporting new services through interworking and convergence with other industries, integrated access and backhaul (IAB) for providing a node for network service area expansion by supporting a wireless backhaul link and an access link in an integrated manner, mobility enhancement including conditional handover and dual active protocol stack (DAPS) handover, and two-step random access for simplifying random access procedures (2-step RACH for NR). There also has been ongoing standardization in system architecture/service fields regarding a 5G baseline architecture (for example, service based architecture or service based interface) for combining network functions virtualization (NFV) and software-defined networking (SDN) technologies, and mobile edge computing (MEC) for receiving services based on UE positions.

If such 5G mobile communication systems are commercialized, connected devices that have been exponentially increasing will be connected to communication networks, and it is accordingly expected that enhanced functions and performances of 5G mobile communication systems and integrated operations of connected devices will be necessary. To this end, new research is scheduled in connection with extended reality (XR) for efficiently supporting augmented reality (AR), virtual reality (VR), mixed reality (MR), etc., 5G performance improvement and complexity reduction by utilizing artificial intelligence (AI) and machine learning (ML), AI service support, metaverse service support, and drone communication.

Such development of 5G mobile communication systems will serve as a basis for developing not only new waveforms for securing coverage in terahertz bands of 6G mobile communication technologies, full dimensional multiple input multiple output (FD-MIMO), multi-antenna transmission technologies such as array antennas and large-scale antennas, metamaterial-based lenses and antennas for improving coverage of THz band signals, high-dimensional space multiplexing technology using orbital angular momentum (OAM), and reconfigurable intelligent surface (RIS), but also full-duplex technology for increasing frequency efficiency of 6G mobile communication technologies and improving system networks, AI-based communication technology for implementing system optimization by utilizing satellites and AI from the design stage and internalizing end-to-end AI support functions, and next-generation distributed computing technology for implementing services at levels of complexity exceeding the limit of UE operation capability by utilizing ultra-high-performance communication and computing resources.

There are various error-correction codes techniques. Representative error-correction codes include convolutional codes, turbo codes, low-density parity-check (LDPC) codes, and polar codes schemes. In particular, turbo codes, low-density parity-check codes, and polar codes are excellent channel codes that have or achieve performance close to theoretical channel capacity and are used in various communication systems today.

A PAC code is a concatenated code that connects a convolutional code and a polar code in series, has excellent error correction performance exceeding that of the polar codes at a specific length and a code rate, and has decoding performance approaching the finite-length dispersion bound, which is a performance limitation due to short code lengths.

Furthermore, while LVA decoding is known to provide constant throughput, there is a path merging phenomenon in which the paths are concentrated in a specific state for the frozen index of a binary trellis, resulting in increasing the likelihood that the LVA discards the accurate path during search. The number of discarded paths increases as the paths in the LVA are concentrated in a few states, which gives rise to the increased probability of discarding the accurate path and the likelihood of degraded performance of the decoding.

As such, there is a need in the art for a method and apparatus for decoding PAC codes with reliable error-correction performance while supporting constant throughput regardless of a signal-to-noise ratio (SNR).

SUMMARY

The disclosure has been made to address at least the above-mentioned problems and/or disadvantages and to provide at least the advantages described below.

Accordingly, an aspect of the disclosure is to provide a decoding method and apparatus that enable efficient decoding of PAC codes in a wireless communication system.

Another aspect of the disclosure is to provide a method of integrating a dynamic list size adjustment function into LVA.

In accordance with an aspect of the disclosure, a receiver of a communication system, the receiver includes a transceiver configured to receive a signal encoded based on PAC coding from a transmitter, and a controller configured to calculate branch metrics of branches defined in a trellis associated with the PAC, calculate a path metric based on an accumulated sum of the branch metrics, determine a path assigned to each state based on the path metric, and estimate a codeword based on the determined path, wherein a number of paths assigned to each state is dynamically determined according to the number of active states, and wherein the active state includes at least one branch.

In accordance with an aspect of the disclosure, a method performed by a receiver of a communication system includes receiving a signal encoded based on PAC coding from a transmitter, calculating branch metrics of branches defined in a trellis associated with the PAC, calculating a path metric based on an accumulated sum of the branch metrics, determining a path assigned to each state based on the path metric, and estimating a codeword based on the determined path, wherein a number of paths assigned to each state is dynamically determined according to the number of active states, and wherein the active state includes at least one branch.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 13 illustrates an example of a process of determining $G_{D\text{-}CRC}$ from a generator function $G_{CRC}$ for CRC encoding according to an embodiment;

DETAILED DESCRIPTION

Figure 1:
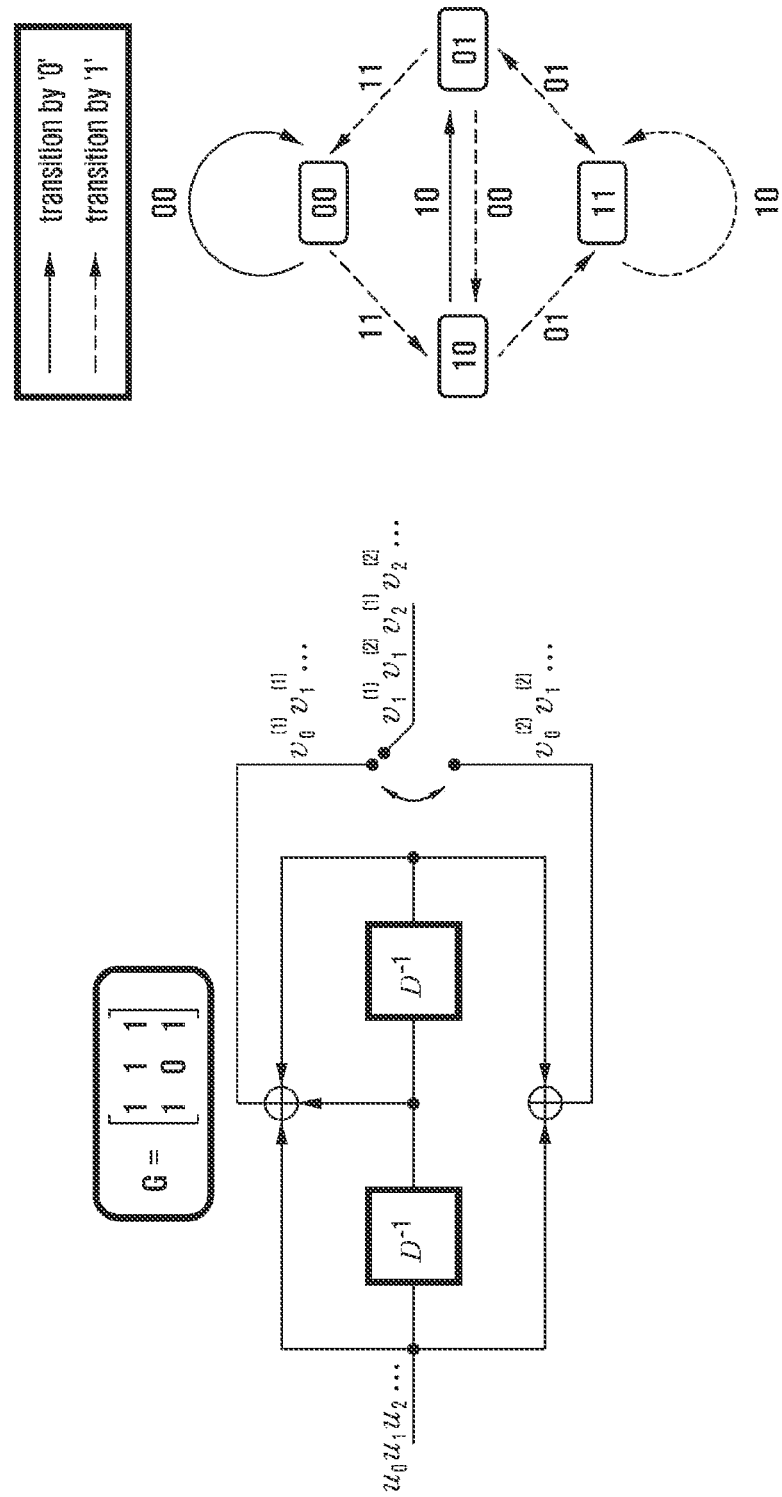
FIG. 1 illustrates an example of a state machine and an encoding method using a convolutional code according to an embodiment.

The following description with reference to the accompanying drawings is provided to assist in a comprehensive understanding of embodiments of the present disclosure. Accordingly, those of ordinary skill in the art will recognize that various changes and modifications of the embodiments described herein can be made without departing from the scope and spirit of the present disclosure. Descriptions of well-known functions and constructions may be omitted for the sake of clarity and conciseness.

Similarly, in the accompanying drawings, some elements may be exaggerated, omitted, or schematically illustrated. The size of each element does not completely reflect the actual size. Identical or corresponding elements are provided with identical reference numerals, and the same or corresponding elements are provided with the same or corresponding reference numerals.

The disclosure is not limited to the embodiments set forth below, but may be implemented in various forms. Throughout the specification, the same or like reference signs indicate the same or like elements.

An element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

Embodiments of the disclosure may be employed in combination, as necessary. For example, a part of an embodiment may be combined with a part of any other embodiment to operate a base station and a terminal. Although the embodiments are described based on frequency division duplex (FDD) LTE systems, other variants based on the technical idea of the embodiments may also be implemented in other communication systems such as time division duplex (TDD) LTE, 5G, or NR systems.

In the drawings, the order of the description does not always correspond to the order in which steps of each method are performed, and the order relationship between the steps may be changed or the steps may be performed in parallel.

Alternatively, some elements may be omitted and only some elements may be included therein without departing from the essential spirit and scope of the disclosure.

Some or all of the contents of each embodiment herein may be combined without departing from the essential spirit and scope of the disclosure.

Herein, a unit refers to a software element or a hardware element, such as a field programmable gate array (FPGA) or an application specific integrated circuit (ASIC), which performs a predetermined function. However, the unit does not always refer to software or hardware and may be constructed either to be stored in an addressable storage medium or to execute one or more processors. Therefore, the unit includes, for example, software elements, object-oriented software elements, class elements or task elements, processes, functions, properties, procedures, sub-routines, segments of a program code, drivers, firmware, micro-codes, circuits, data, database, data structures, tables, arrays, and parameters. The elements and functions provided by the unit may be either combined into fewer elements, or a unit, or divided into more elements, or a unit. Moreover, the elements and units may be implemented to reproduce one or more central processing units (CPUs) within a device or a security multimedia card, and the unit may include one or more processors.

Embodiments of the disclosure are mainly directed to new radio access network (NR) and packet core (also referred to as 5G system, 5G core network or next generation core (NG core)) as a core network in the 5G mobile communication standards specified by the 3rd generation partnership project (3GPP) that is a mobile communication standardization group, but the disclosure may be applied to other communication systems having similar backgrounds through some modifications without significantly departing from the scope of the disclosure.

In the 5G system, a network data collection and analysis function (NWDAF), which is a network function for analyzing and providing data collected in a 5G network, may be defined to support network automation. The NWDAF may collect/store/analyze information from the 5G network and provide the results to unspecified network functions (NFs), and the analysis results may be used independently in each NF.

Herein, some of terms and names defined in the 3GPP standards (standards for 5G, NR, LTE, or similar systems) may be used for the sake of descriptive convenience. However, the disclosure is not limited by these terms and names and may be applied in the same manner to systems that conform other standards.

Herein, terms for identifying access nodes and referring to network entities, messages, interfaces between network entities, various identification information, and the like are illustratively used for the sake of descriptive convenience. Therefore, the disclosure is not limited by the terms as used herein, and other terms referring to subjects having equivalent technical meanings may be used.

Insufficient spectrum has always been a major bottleneck for wireless communication networks, and finding new spectrum is essential to manage the increasingly rapid growth of data traffic. However, unknown high frequency bands suffer severe propagation losses, which inevitably leads to insufficient coverage areas. One method to solve this coverage limitation is to improve a baseband chain by using advanced signal processing techniques, and channel coding is expected to lead this improvement.

In general, when a transmitter and a receiver perform data transmission and reception in a communication system, a data error may occur due to noise existing in a communication channel. As an encoding scheme that is designed to enable a receiver to correct an error caused by a communication channel, there are an error detection code (EDC) scheme and an error correcting code (ECC) scheme. The EDC scheme enables the receiver to identify whether the received data includes errors, while the ECC scheme enables the receiver to correct errors included in the received data. ECC is also referred to as channel coding or forward error correction (FEC).

Other ECC techniques include convolutional codes, turbo codes, low-density parity-check (LDPC) codes, and polar codes schemes. In particular, turbo codes, LDPC codes, and polar codes are excellent channel codes that have or achieve performance close to theoretical channel capacity and are used in various communication systems today.

FIG. 1 illustrates an example of a state machine and an encoding method using a convolutional code according to an embodiment.

An encoding method using a convolutional code outputs a codeword by using both a currently input bit value and a predetermined number of previously input bits. In convolutional coding, one or more memory units are used to store and utilize a predetermined number of previously input bits. In FIG. 1, two memory units $D_1$ and $D_2$ are used as an example. The output bits may be determined based on a modulo-2 operation of the input bits and the bits stored in the memory units. A modulo-2 operation produces a remainder when the sum of each of bits used in the operation is divided by 2. In FIG. 1, the output bit is determined by performing a modulo-2 operation on the bit values connected via $\oplus$. For example, input bits $u_i$, the memory unit $D_1$, and the memory unit $D_2$ are all connected via $\oplus$, and thus $v_i^{(1)}$ may be determined by performing a modulo-2 operation on the input bits, the bits stored in memory unit $D_1$, and the bits stored in memory unit $D_2$. The input bits $u_i$ and memory unit $D_2$ are connected via $\oplus$, and thus $v_i^{(2)}$ may be determined by a modulo-2 operation of the input bits $u_i$ and the bits stored in memory unit $D_2$. The relationship among the output bit, the input bit, and the bits stored in the memory units may be represented by a generator vector $g_i$ or a generator matrix G. $v_i^{(1)}$ may be represented by a generator vector $g_1=[1\ 1\ 1]$ for $v_i^{(1)}$, since a modulo-2 operation are applied for all the input bits $u_i$, the bits stored in memory unit $D_1$, and the bits stored in memory unit $D_2$. Similarly, $v_i^{(2)}$ may be represented by a generator vector $g_2=[1\ 0\ 1]$ for $v_i^{(2)}$, since a modulo-2 operation are applied for the input bits $u_i$ and the bits stored in memory unit $D_2$. In the example in FIG. 1, two output bits $v_i^{(1)}$ and $v_i^{(2)}$ are generated for one input bit $u_i$, and a generator matrix G may be represented by $$G = \begin{bmatrix} 1 & 1 & 1 \\ 1 & 0 & 1 \end{bmatrix}.$$

In this case, two output bits $v_i^{(1)}$ and $v_i^{(2)}$ are generated for one input bit $u_i$, resulting in a code rate of ½.

In each of memory units $D_1$ and $D_2$, previously input bits or bit values stored in the previous memory unit are sequentially shifted and stored. Bits input at a previous time are shifted and stored in the memory unit $D_1$, and bits stored in the memory unit $D_1$ at a previous time are shifted and stored in the memory unit $D_2$.

A specific example will be described as follows by assuming that the input bit string is $[u_0\ u_1\ u_2\ u_3\ \ldots] = [1\ 0\ 1\ 1\ \ldots]$ in the structure shown in FIG. 1.

At start time instance $t=t_0$, the input bit $(u_0=1)$ is input. For convenience of explanation, all the initial values stored in memory unit $D_1$ and memory unit $D_2$ are assumed to be 0. The output bits at time instance $t=t_0$ are $v_0^{(1)}$ and $v_0^{(2)}$ where $v_0^{(1)}$ may be determined as 1 by a modulo-2 operation on 1 (the input bit), 0 (the bit stored in memory unit $D_1$), and 0 (the bit stored in memory unit $D_2$), and $v_0^{(2)}$ (may be determined to be 1 by a modulo-2 operation on 1 (the input bit) and 0 (the bit stored in memory unit $D_2$). Accordingly, at time instance t=t0, the output value for the input bit $u_0=1$ is $v_0^{(1)}v_0^{(2)}=11$.

At time instance $t=t_1$, the input bit $(u_1=0)$ is input. The memory unit $D_1$ stores the input bit $(u_1=0)$ at the previous time instance $(t=t_0)$, and the memory unit $D_2$ stores the bit 0 stored in memory unit $D_1$ at the previous time instance $(t=t_0)$. The output bits at time instance $t=t_1$ are $v_1^{(1)}$ and $v_1^{(2)}$, where $v_1^{(1)}$ may be determined as 1 by a modulo-2 operation on 0 (the input bit), 1 (the bit stored in memory unit $D_1$), and 0 (the bit stored in memory unit $D_2$), and $v_1^{(2)}$ may be determined as 0 by a modulo-2 operation on 0 (the input bit) and 0 (the bit stored in memory unit $D_2$). Therefore, at time instance $t=t_1$, the output value for input bit $(u_1=0)$ is $v_1^{(1)}v_1^{(2)}=10$.

At time $t=t_2$, the input bit $(u_2=1)$ is input. The memory unit $D_1$ stores the input bit $(u_1=0)$ at the previous time instance $(t=t_1)$, and the memory unit $D_2$ stores the bit 1 stored in memory unit $D_1$ at the previous time instance $(t=t_1)$. At time $t=t_2$, the output bits are $v_2^{(1)}$ and $v_2^{(2)}$, where $v_2^{(1)}$ may be determined as 0 by a modulo-2 operation on 1 (the input bit), 0 (the bit stored in memory unit $D_1$), and 1 (the bit stored in memory unit $D_2$), and $v_2^{(2)}$ may be determined as 0 by a modulo-2 operation on 1 (the input bit) and 1 (the bit stored in memory unit $D_2$). Accordingly, at time $t=t_2$, the output value for input bit $(u_2=1)$ is $v_2^{(1)}v_2^{(2)}=00$.

At time instance $t=t_3$, the input bit $(u_3=1)$ is input. The memory unit $D_1$ stores the input bit $(u_2=1)$ at the previous time instance $(t=t_2)$, and memory unit $D_2$ stores the bit 0 stored in memory unit $D_1$ at the previous time instance $(t=t_2)$. At time instance $t=t_3$, the output bits are $v_3^{(1)}$ and $v_3^{(2)}$, where $v_3^{(1)}$ is determined as 0 by a modulo-2 operation on 1 (the input bit), 1 (the bit stored in memory unit $D_1$), and 0 (the bit stored in memory unit $D_2$), and $v_3^{(2)}$ may be determined as 1 by a modulo-2 operation on 1 (the input bit) and 0 (the bit stored in memory unit $D_2$). Accordingly, at time instance $t=t_2$, the output value for input bit $(u_3=1)$ is $v_3^{(1)}v_3^{(2)}=0$.

The input bit (u), the bit stored in memory unit $D_1$, the bit stored in memory unit $D_2$, and the output bits $v^{(1)}$, $v^{(2)}$ according to the time instance t in the encoding process described above may be represented as shown below in Table 1.

TABLE 1

| t | u | $D_1$ | $D_2$ | $v^{(1)}$ | $v^{(2)}$ | $v^{(1)}v^{(2)}$ |
|---|---|---|---|---|---|---|
| $t_0$ | 1 | 0 | 0 | 1 | 1 | 11 |
| $t_1$ | 0 | 1 | 0 | 1 | 0 | 10 |
| $t_2$ | 1 | 0 | 1 | 0 | 0 | 00 |
| $t_3$ | 1 | 1 | 0 | 0 | 1 | 01 |
| ... | ... | ... | ... | ... | ... | ... |

The combination of bit values that may be included in a memory unit in a convolutional code is called a state. In FIG. 1, there are two memory units $D_1$ and $D_2$ and each memory unit may have a value of 0 or 1, and thus a total of four states may be defined as {00, 01, 10, 11}. In general, when m memory units are used, each of the m memory units may have a value of 0 or 1, and thus a total of $2^m$ states may be defined. As described above, when an input bit of 0 or 1 is input at a specific time instance, the output bits are determined based on the input bits and the bit values stored in the memory units $D_1$ and $D_2$, and the bit values, which are stored in the memory units $D_1$ and $D_2$, i.e., the states, are updated. This process of updating the state is referred to as a transition. Note that the state before update and the state after the update may be the same state, and the update to the same state may also be expressed as a transition.

Assuming the situation where the input bit string described above is $[u_0 \ u_1 \ u_2 \ u_3 \ \ldots] = [1 \ 0 \ 1 \ 1 \ \ldots]$, at time instance $t=t_0$, the initial state is 00, and when 1 is input as the input bit, 11 is output as the output bit, and the state transitions from 00 to 10. At time instance $t=t_1$, the state is 10, and when 0 is input as the input bit, 10 is output as the output bit and the state transitions to 01. At time instance $t=t_2$, the state is 01, and when 1 is input as the input bit, 00 is output as the output bit, and the state transitions to 10. At time instance $t=t_3$, the state is 10, and when 1 is input as the input bit, 01 is output as the output bit, and the state transitions to 11. As such, a graph that shows an output value generated depending on the input bit in a specific state and a state in which the bit value stored in the memory unit changes is called a state machine.

Figure 2:
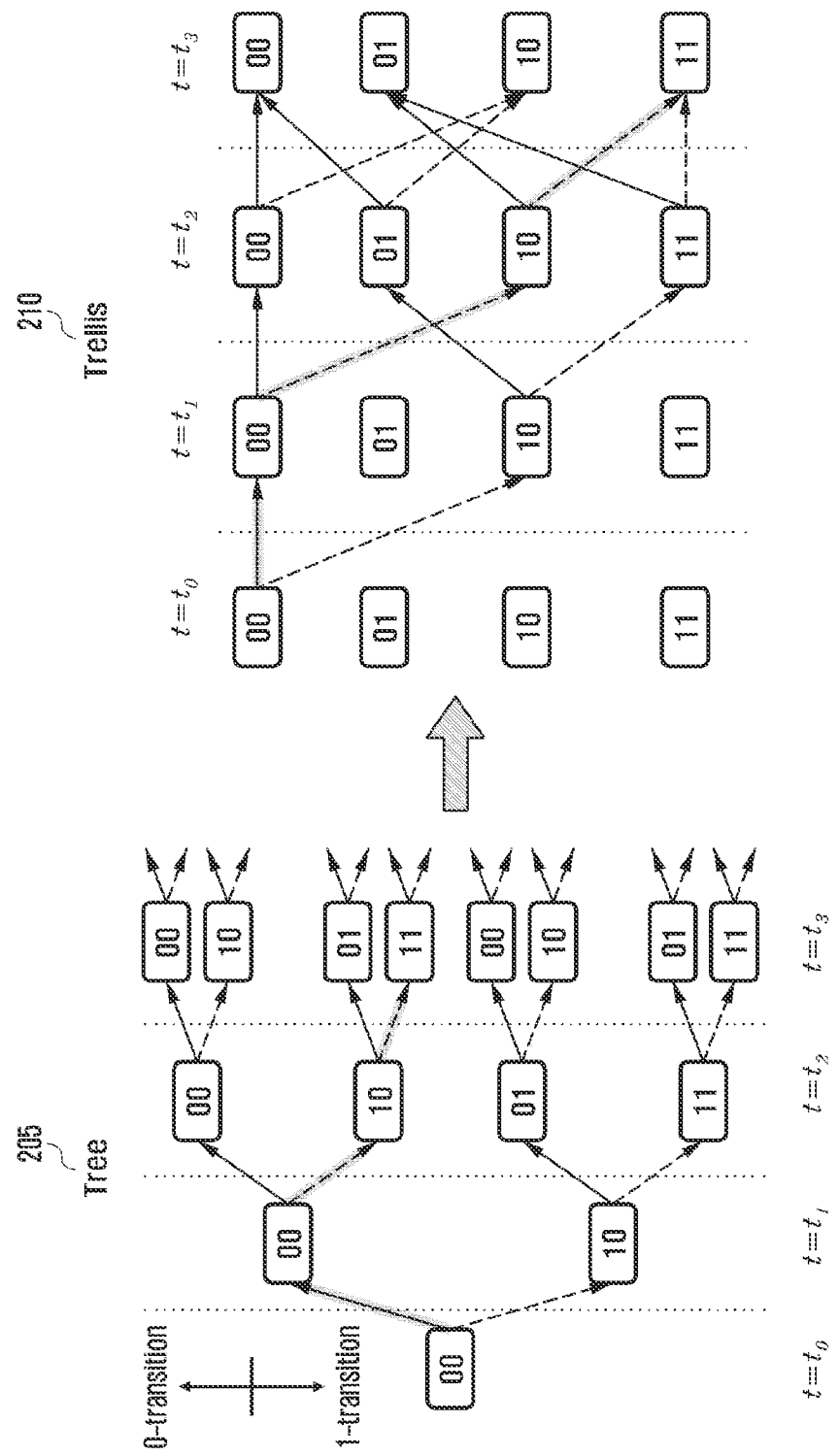
FIG. 2 illustrates a tree structure and a trellis structure, which are examples of a code graph based on convolutional codes according to an embodiment.

FIG. 2 illustrates a tree structure and a trellis structure, which are examples of a code graph based on convolutional codes according to an embodiment.

Referring to FIG. 2, a tree structure 205 refers to a code graph in which a transition process of states according to the input bits expressed through a state machine is displayed in a chronological order. Assuming that the initial state is 00 at time instance $t=t_0$, when 0 is input in the initial state 00, the state transitions to 00 at time instance $t=t_1$, and when 1 is input, the state transitions to 10 at time instance $t=t_1$. Similarly, when the state is 00 at time instance $t=t_1$, the state transitions to 00 at time instance $t=t_2$ when 0 is input, and the state transitions to 10 at time instance $t=t_2$ when 1 is input. When the state is 10 at time instance $t=t_1$, the state transitions to 01 at time instance $t=t_2$ when 0 is input, and the state transitions to 11 at time instance $t=t_2$ when 1 is input. The same process may be applied with respect to time ($t=t_2, t_3, \ldots$,) and the transitions process of all states in chronological order may be represented as a tree structure 205 as shown in FIG. 2.

In a state machine, the process of transitioning from one state to another state corresponds to a specific output value. For example, referring to the state machine in FIG. 1, the process of transitioning from state 00 to state 00 corresponds to an output value of 00, and the process of transitioning from state 00 to state 10 corresponds to an output value of 11. In addition, the process of transitioning from state 10 to state 01 corresponds to an output value of 10, and the process of transitioning from state 10 to state 11 corresponds to an output value of 01.

Similarly, in the tree structure 205 shown in FIG. 2, the transitions that occur at each time instance may each correspond to one output value. In the tree structure 205, a path from an initial state at time instance $t=t_0$ to a specific state at time instance $t=t_1$ may be defined as a set of transitions that occur at each time instance, and thus one codeword that is defined by the output values of each of the transitions along the corresponding path may be determined.

The trellis structure 210 refers to a code graph obtained by compressing the same state for each time instance into one state in the tree structure 205 described above. For example, in the tree structure 205, there are two paths to reach the state "00" at time instance $t=t_3$. One path follows $00(t=t_0) \rightarrow 00(t=t_1) \rightarrow 00(t=t_2) \rightarrow 00(t=t_3)$, and the other path follows $00(t=t_0) \rightarrow 10(t=t_1) \rightarrow 01(t=t_2) \rightarrow 00(t=t_3)$. As such, a structure in which the same state that may be reached through different paths at a specific time instance is represented as one state is called a trellis structure 210. Similar to the tree structure 205, even in the trellis structure 210, the path from the initial state at time instance $t=t_0$ to reach a specific state at time instance $t=t_n$ may be defined as a set of transitions that occur at each time instance, and thus one codeword defined through the output values of each of the transitions along the corresponding path may be determined.

The expression time instance used in the description of the ideal tree structure 205 and trellis structure 210 may be replaced by any term that may be used to index the time series, such as stage, index, etc.

Among error correction codes techniques, a polar code is a channel code to achieve channel capacity, by using a phenomenon called channel polarization, in a simple and effective manner. In the process of transmitting multiple bits through independent bit channels, when encoding using a structured generator matrix and successive cancellation (SC) decoding are used, the channel for each bit is transformed into a virtual polarization-synthesized channel. During this process, some synthesized channels become good channels with channel capacity close to 1, while other synthesized channels become poor channels with channel capacity close to 0, which is the minimum channel capacity. In this case, the overall sum of the channel capacities of the synthesized channels remains the same before and after the transformation. Since channel polarization is maximized as the code length increases, the good channel has a channel capacity of 1 and the poor channel has a channel capacity of 0. Therefore, the transmitter may easily and effectively achieve the channel capacity for a predetermined channel by transmitting, to the good channel, the information bits desired to be transmitted and assigning frozen bits to the poor channel, theoretically. In this process, the location and value of the frozen bits are assumed to be known by the receiver. The SC decoding scheme for polar codes may be easily modified and extended to near-ML or ML-like decoding schemes, such as SC-list (SCL) decoding, SC-stack (SCS) decoding, SC-flip (SCF) decoding, etc. These improved decoding algorithms achieve better error correction performance. For this reason, the third generation partnership project (3GPP) NR, which is the 5G communication standard, uses polar codes to transmit short length control information.

PAC codes have recently been introduced as a new variant of polar codes. PAC codes have excellent error-correction performance and are one of the promising candidates for improved control channels. In polarized codes, bits transmitted over a low-confidence channel are error-prone and incur performance losses. PAC codes place a one-to-one convolutional transform before the polar transform, and this pre-transform improves performance by introducing additional correlation between the input bits.

It has been shown that PAC codes under Fano decoding are superior to CRC-aided polar (CA-polar) codes, which are a coding scheme for the 5G new radio control channel. The Fano algorithm is a depth-first tree search algorithm in which upward and downward movement is guided by a dynamic threshold $T_{Fano}$. When anode at the current depth does not have a likelihood metric greater than $T_{Fano}$, the decoder returns to the previous parent node, searches subsequent nodes again, and updates $T_{Fano}$ if necessary.

Due to its backtracking function, the Fano decoder is likely to search for the same sequence of nodes multiple times, resulting in high time complexity in the worst-case. In real control channel scenarios, this may reduce the number of possible blind decoding attempts and significantly degrade the function of blind decoding. Additionally, at low SNR, the problem is worsened because the path metric is relatively low, and thus the threshold needs to be updated more frequently. As a result, the ANV, which is an indicator of computational complexity, becomes a random variable dependent on SNR. In other words, the number of bits that may be decoded per unit time varies depending on the SNR.

Figure 3:
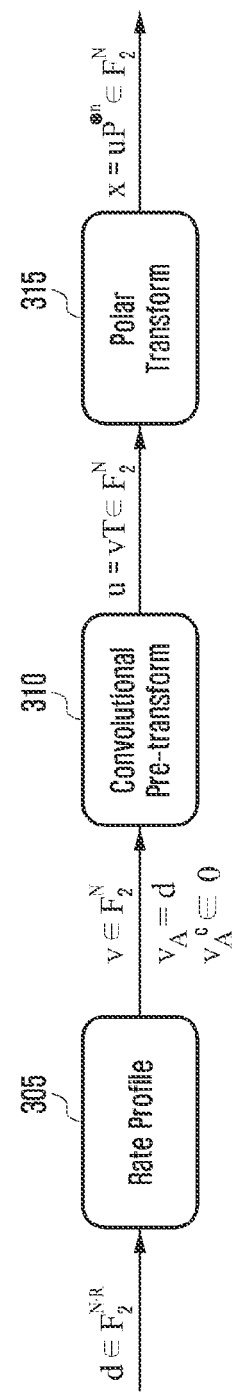
FIG. 3 illustrates an encoding method based on a PAC code according to an embodiment.

FIG. 3 illustrates an encoding method based on a PAC code according to an embodiment.

Referring to FIG. 3, a PAC code is a concatenated code in which the aforementioned convolutional code and polar code are connected in series, and the PAC code has excellent error correction performance that exceeds that of a polar code at a specific length and code rate, and has a decoding performance close to the finite-length dispersion bound which is known as performance limitation due to short code lengths.

An information bit $d \in \mathbb{F}_2^{N \cdot R}$ of length N*R is subjected to a rate profile 305 to obtain a length N of $v \in \mathbb{F}_2^N$, where N represents the length of the codeword output by the PAC code and R represents the code rate. v obtained through the rate profile 305 consists of $v_{\mathcal{A}}$ corresponding to the information bit d and $v_{\mathcal{A}^c}$ (or $v_{\mathcal{F}}$) corresponding to the frozen bits generated during the rate profile 305 process, where the location and value of the frozen bits (e.g., 0) are assumed to be known by both the transmitter and receiver, as previously described herein. Determining an index set $\mathcal{A}$ corresponding to an information bit is called rate-profiling, which is similar to selecting a bit channel in polar codes. However, the convolutional code and polar code described above may each be expressed as a matrix representing the relationship between input and output and, when convolutional pre-transform 310 is applied, $u=vT \in \mathbb{F}_2^N$ is obtained with regard to the topology matrix T, and when polar transform 315 is applied to the corresponding u, a codeword $x=uP^{\oplus n} \in \mathbb{F}_2^N$ of length N is finally output. As described above, the PAC code is a concatenated code that connects a convolutional code and a polar code, and the PAC code may be expressed through the tree structure or trellis structure described above for the convolutional code. The Fano decoding method, which has been proposed as a decoding algorithm for the PAC code as the prior art, is a depth first search decoding method that sequentially searches the tree structure of the PAC code.

Figure 4:
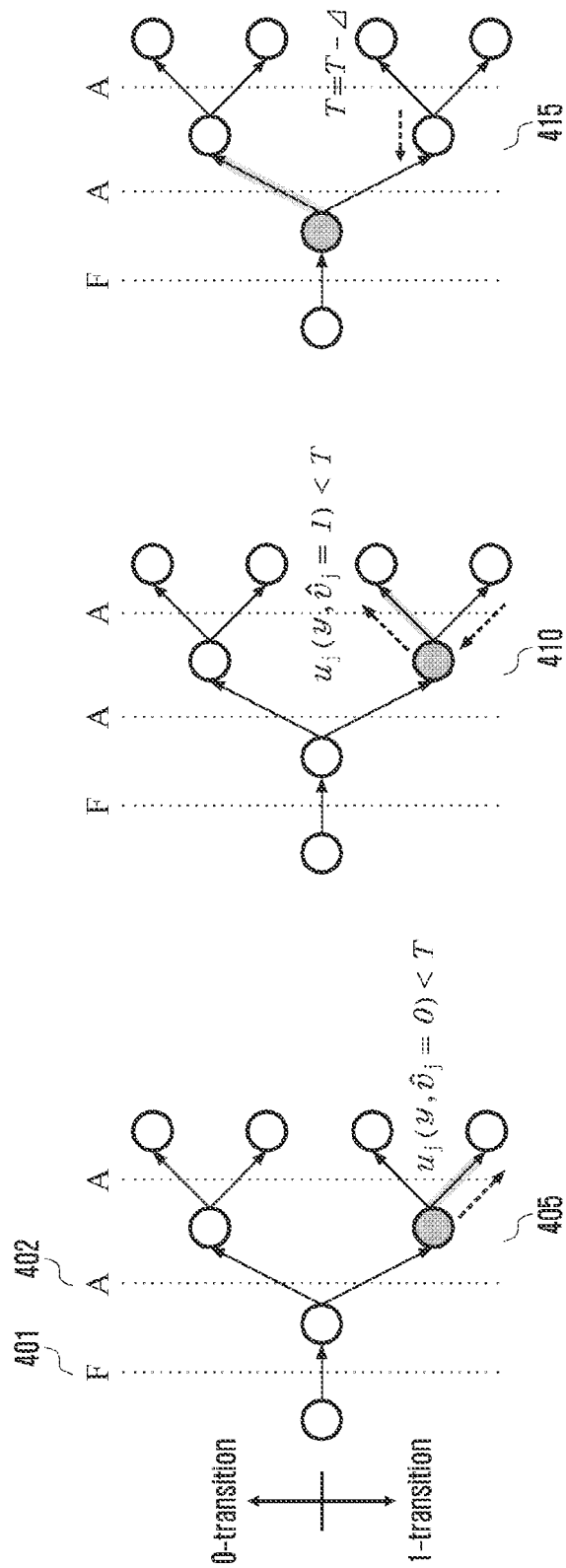
FIG. 4 illustrates a Fano decoding method using a tree structure according to an embodiment.

FIG. 4 illustrates a Fano decoding scheme using a tree structure according to an embodiment.

Referring to FIG. 4, each node in the form of a circle represents a state. As previously described with reference to FIG. 2, in each state of the tree structure, a transition to the next state may occur depending on the input bit. There are two possible next states that can be transitioned from a specific state, depending on whether the transition occurs with an input bit of 0 or an input bit of 1. A metric based on the log-likelihood ratio (LLR) may be defined as a measure of the probability of a transition with a 0 or a transition with a 1. The decoder may determine that a transition has a high probability of occurring if the calculated metric is high, and a transition has a low probability of occurring if the calculated metric is low. Alternatively, depending on a method of defining a metric, conversely, if the calculated metric is high, the probability of the corresponding transition occurring may be determined to be low, and if the calculated metric is low, the probability of the corresponding transition occurring may be determined to be high. The Fano decoding method is a decoding method in which a metric indicating the probability of transition by 0 or 1 in each state of the tree structure is calculated and the most likely path is searched for based on the metric so as to find a codeword corresponding to the corresponding path.

Specifically, the process of searching for the most likely path will be described with reference to FIG. 4.

In FIG. 4, F 401 represents a transition by a frozen bit, and only a transition by a predetermined bit (e.g., 0) may occur. A 402 denotes a transition by an information bit d, and a transition by 0 or 1 may occur depending on the value of the information bit. In FIG. 4, a metric indicating the probability of a transition occurring by 0 in the current state is indicated by $\mu_j(y, \hat{v}_j=0)$, and the metric indicating the probability of occurring by a transition by 1 is indicated by $\mu_j(y, \hat{v}_j=1)$.

At reference numeral 405, the decoder first calculates $\mu_j(y, \hat{v}_j=0)$, which represents the probability in which a transition by 0 will occur, and compares the calculated probability with a predefined threshold T. If the calculated value of $\mu_j(y, \hat{v}_j=0)$ is greater than the threshold T, the decoder determines that the probability of a transition occurring by 0 is sufficiently high and proceeds to the next state in which a transition occurs by 0. However, if the calculated value $\mu_j(y, \hat{v}_j=0)$ is less than the threshold T, the decoder determines that the probability of a transition by 0 is not sufficiently high. At reference numeral 410, the decoder calculates $\mu_j(y, \hat{v}_j=1)$, which represents the probability of a transition occurring by 1, and compares the same with the threshold T. If the calculated $\mu_j(y, \hat{v}_j=1)$ is greater than the threshold T, the decoder determines that the probability of a transition occurring by 1 rather than 0 is sufficiently high and proceeds to the next state in which a transition occurs by 1.

If both values of $\mu_j(y, \hat{v}_j=0)$ and $\mu_j(y, \hat{v}_j=1)$ are less than the threshold T, the decoder determines that the path taken so far is incorrect, and returns to the previous state and proceeds with the path search again. At reference numeral 415, when returning to the previous state, the decoder lowers the threshold T used for the current path by Δ and defines (T−Δ) as the new threshold. The threshold is lowered because, if the decoder returns to the previous state and performs the path search again, but the metrics along the other paths fail to exceed the threshold T, the decoder returns to the current state again and continuously uses the same threshold T, thereby resulting in no further path search and no decoding. The decoder proceeds with path search by returning to the previous state, performing the process of calculating the metrics of possible transitions, and comparing the metrics with the threshold, in the same manner as described above with reference to the current state. If the decoder returns to the current state during the path search process, the decoder proceeds with the path search by using the lowered threshold (T−Δ).

In Fano decoding, when the calculated metric fails to exceed the threshold, an operation of backtracking, which attempts to going back the path traveled and search the path again, and an operation of lowering the threshold are performed. The number of backtracking and thresholding adjustment performed during the entire Fano decoding process depends on several parameters, including an SNR. For example, when the SNR is high, decoding may be successfully performed even through a small number of backtracking and threshold adjustment operations, whereas when the SNR is low, a very large number of backtracking and threshold adjustment operations need to be performed. Therefore, the Fano decoding method has a problem in that throughput is variable depending on the SNR and has very high complexity, especially when the SNR is low. Although the PAC code is a promising channel coding method for the control channel of future wireless networks, the variable throughput and worst-case time complexity of Fano decoding make it difficult to use the PAC code due to its nearly optimal error correction performance under Fano decoding.

To improve the problems of the Fano decoding scheme, there is a Viterbi decoding scheme that searches a trellis structure rather than a tree structure.

Figure 5:
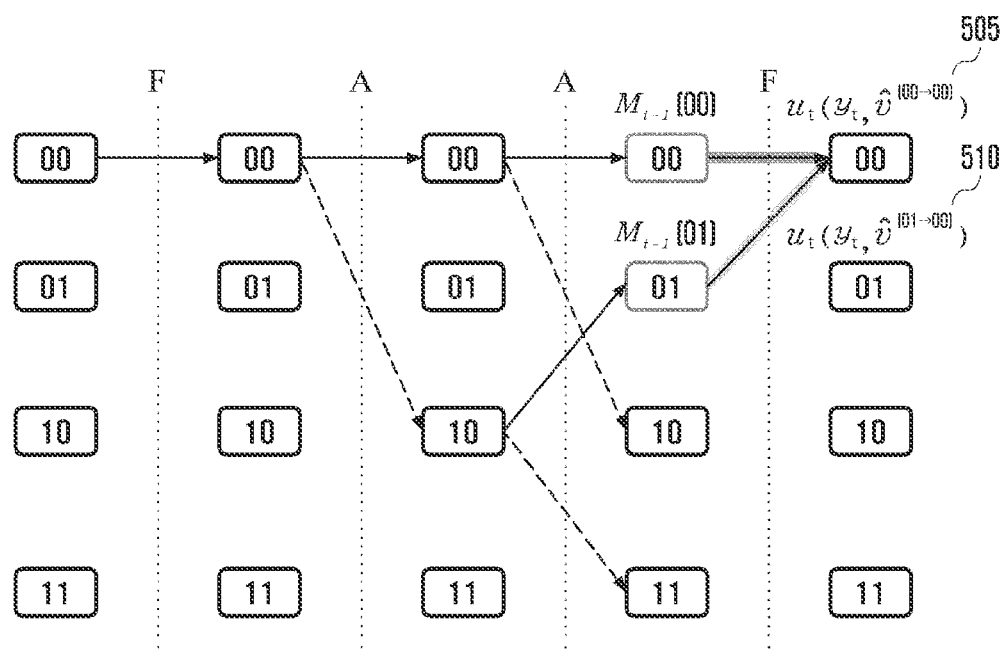
FIG. 5 illustrates a Viterbi decoding method using a trellis structure according to an embodiment.

FIG. 5 illustrates a Viterbi decoding scheme using a trellis structure according to an embodiment.

Referring to FIG. 5, in the trellis structure, similar to the tree structure described in reference to FIG. 4, a metric based on the LLR may be defined as a measure of the probability of a transition occurring from a specific state to a next state. In FIG. 5, a metric for a transitioning from the state s' to the state s at time instance t may be represented by $\mu_t(y_t, \hat{v}^{(s' \to s)})$. This is referred to as a branch metric. For example, in FIG. 5, the probability in which a transition from 00→00 occurs at time instance t may be represented by $\mu_t(y_t, \hat{v}^{(00 \to 00)})$ 505, and the probability in which a transition from 01→00 occurs at time instance t may be represented by $\mu_t(y_t, \hat{v}^{(01 \to 00)})$ 510. Herein, the branch metric $\mu_t(y_t, \hat{v}^{(s' \to s)})$ is defined using a negative LLR and therefore, the smaller the LLR value, the higher the probability of a transition occurring. However, the branch metric is a parameterization of the probability of each transition occurring, and the definition method is not limited to the example in the disclosure. For example, if $\mu_t(y_t, \hat{v}^{(s' \to s)})$ is defined using a positive LLR, the higher the LLR value, the higher the probability of a transition occurring, and the disclosure does not limit a method for defining a metric.

If a branch metric $\mu_t(y_t, \hat{v}^{(s' \to s)})$ is a value that individually represents the probability of a transition from a specific state to the next state occurring, $M_t(s)$ is defined as a metric that represents the probability of reaching a state s at time instance t through a particular path through the accumulation of these transitions. $M_t(s)$ is referred to as a path metric. The path metric $M_t(s)$ may be defined as the accumulated sum of the branch metrics corresponding to the transitions along the path to reach a state s at time t. For example, in FIG. 5, the path to reach state "00" at time instance (t−1) is 00→00→00→00, where $M_{t-1}(00)$ is the accumulated sum of the branch metrics corresponding to the transitions along the corresponding path. As another example, in FIG. 5, the path to reach state "01" at time instance (t−1) is 00→00→10→01, where $M_{t-1}(01)$ is the accumulated sum of the branch metrics corresponding to the transitions along the corresponding path. Herein, the metrics $\mu_t(y_t, \hat{v}^{(s' \to s)})$ corresponding to each transition are defined via negative LLR, and thus, the path metric $M_t(s)$ defined as the accumulated sum of the branch metrics also indicates that the smaller the LLR value, the higher the probability of a transition occurring. Viterbi decoding is a decoding method that finds a codeword corresponding to the path by searching for the path with the highest probability of reaching each state at a specific time instance based on the branch metrics and the probability defined as the accumulated sum of the branch metrics.

Since a trellis structure, unlike a tree structure, illustrates that the same state reached through different paths at a specific time instance is compressed into one state, a case in which multiple branches are merged to one state at time instance t may occur. For example, referring to FIG. 5, both the transition according to 00(t−1)→00(t) and the transition according to 01(t−1)→00(t) reach state 00 at time instance t. Viterbi decoding is a method of finding a single codeword through trellis structure search, and thus one path needs to be specified for decoding to be successful. Therefore, when there are multiple paths to reach each state at specific time instance, Viterbi decoding selects only one path with the highest probability.

Figure 6:
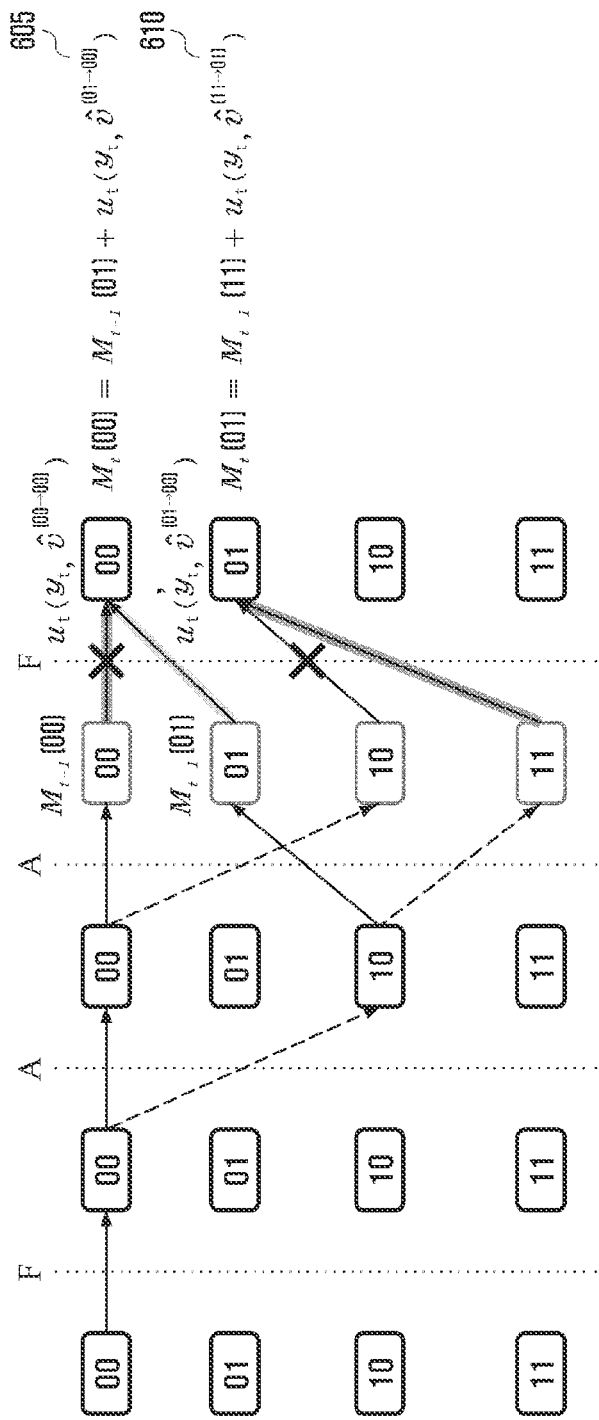
FIG. 6 illustrates a method for path selection in Viterbi decoding according to an embodiment.

FIG. 6 illustrates a method for path selection in Viterbi decoding according to an embodiment.

Referring to FIG. 6, the path metric, which represents the probability of reaching state "00" at time instance t, may be represented by $M_t(00)$. However, there are two possible paths to reach state "00" at time instance t.

One is a path in which transitions from state "00" at time instance (t−1) to state "00" at time instance t occurs. Since this path corresponds to a path of reaching state "00" at time instance (t−1) and additionally, in which a transition occurs from state 00 at time instance (t−1) to "00" at time instance t, the metric representing the probability of reaching state "00" at time instance t along the corresponding path may be calculated by $M_{t-1}(00) + \mu_t(y_t, \hat{v}^{(00 \to 00)})$.

The other one is a path in which a transition from state "01" at time instance (t−1) to state "00" at time instance t occurs. Since this path corresponds to a path of reaching state "01" at time instance (t−1) and additionally, in which a transition occurs from state 01 at time instance (t−1) to "00" at time instance t, the metric representing the probability of reaching state "00" at time instance t along the corresponding path may be calculated by $M_{t-1}(01) + \mu_t(y_t, \hat{v}^{(01 \to 00)})$ 605.

In Viterbi decoding, to select a path with a higher probability among the two paths, a path having a lower value between $M_{t-1}(00) + \mu_t(y_t, \hat{v}^{(00 \to 00)})$ and $M_{t-1}(01) + \mu_t(y_t, \hat{v}^{(01 \to 00)})$ 605 is selected. The example in FIG. 6 shows that $M_t(00) = M_{t-1}(01) + \mu_t(y_t, \hat{v}^{(01 \to 00)})$ has a lower value (i.e., a higher probability). Therefore, the path for 01(t−1)→00(t) is selected.

Similarly, the path metric representing the probability of reaching state "01" at time instance t may be represented by $M_t(01)$. However, as shown in FIG. 6, there are two paths to reach the state "01" at time instance t. One is a path in which transitions from state "10" at time instance (t−1) to state "01" at time instance t occurs. Since this path corresponds to a path of reaching state "10" at time instance (t−1) and additionally, in which a transition occurs from state "10" at time instance (t−1) to "01" at time instance t, the metric representing the probability of reaching state "01" at time instance t along the corresponding path may be calculated by $M_{t-1}(10) + \mu_t(y_t, \hat{v}^{(10 \to 01)})$ The other one is a path in which transitions from state "11" at time instance (t−1) to state "01" at time instance t occurs. Since this path corresponds to a path of reaching state "11" at time instance (t−1) and additionally, in which a transition occurs from state "11" at time instance (t−1) to "01" at time instance t, the metric representing the probability of reaching state "01" at time instance t along the corresponding path may be calculated by $M_{t-1}(11)+\mu_t(y_t, \hat{v}^{(11 \to 01)})$ 610. In Viterbi decoding, to select a path with a higher probability among the two paths, a path having a lower value between $M_{t-1}(10)+\mu_t(y_t, \hat{v}^{(10 \to 01)})$ and $M_{t-1}(11)+\mu_t(y_t, \hat{v}^{(11 \to 01)})$ 610 is selected. The example in FIG. 6 shows that $M_t(01)=M_{t-1}(11)+\mu_t(y_t, \hat{v}^{(11 \to 01)})$ 610 has a lower value (i.e., a higher probability) and therefore the path for $11(t-1) \to 01(t)$ is selected.

Accordingly, the path metric $M_t(s)$ representing a path having the state s at time instance t may be determined by the lowest value of the metrics $M_{t-1}(s')+\mu_t(y_t, \hat{v}^{(s' \to s)})$ representing the probability of having state s' at time instance (t−1) and additionally transitioning from the state s' to the state s. This is expressed mathematically as shown below in Equation (1).

$$M_t(s) = \min_{s' \in S_t^{(s)}} \{M_{t-1}(s') + \mu_t(y_t, \hat{v}^{(s' \to s)})\} \quad (1)$$

In Equation (1), $S_t^{(s)}$ is a set of states s' having a path to reach the state s at time instance t, which is a subset of the set of all states $S = \{s_1, s_2, \ldots, s_{2^m}\}$.

Figure 7:
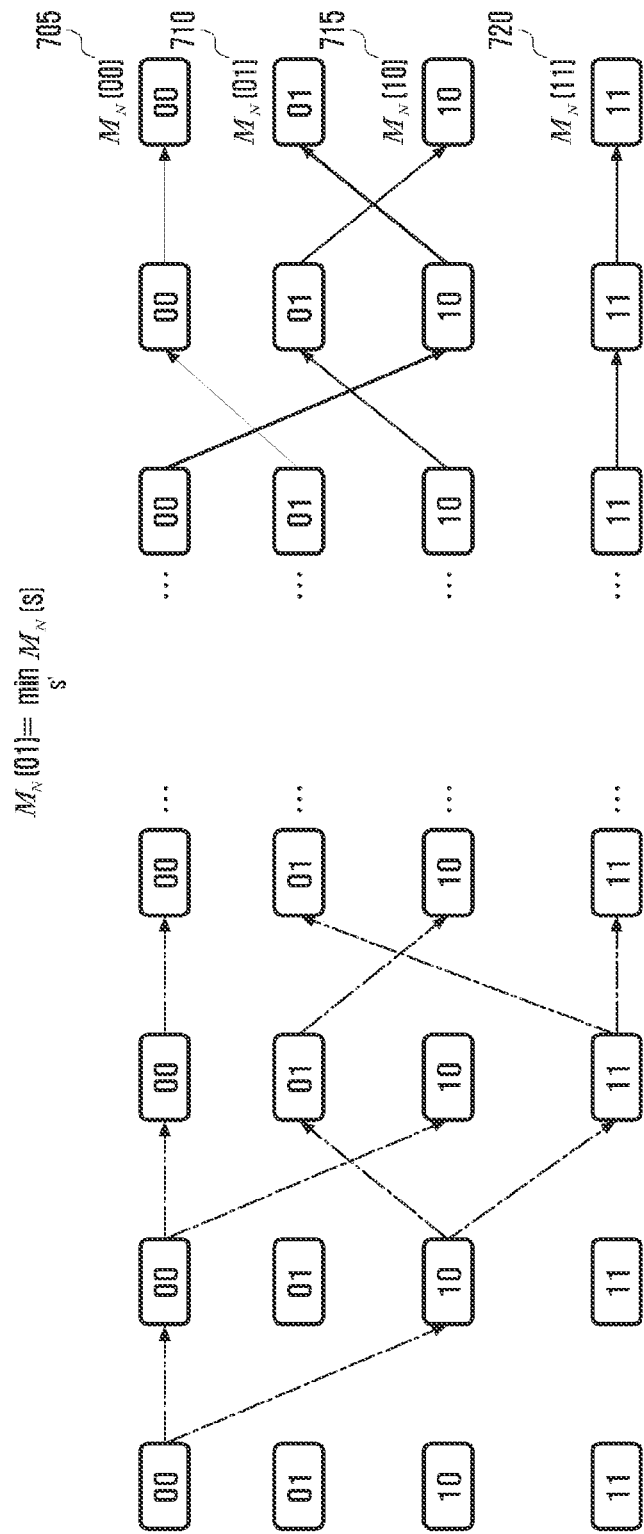
FIG. 7 illustrates a method for determining a codeword in Viterbi decoding according to an embodiment.

FIG. 7 illustrates a method for determining a codeword in Viterbi decoding according to an embodiment.

Referring to FIG. 7, Viterbi decoding is proceeded by selecting only one path to reach each state at each time instance through the path selection described with reference to FIG. 6, and when performing up to the last time instance, paths to reach each state s at the last time instance N and path metrics $M_N(s)$ corresponding thereto are determined individually. A path with the highest probability of reaching the state s at the last time instance, i.e., a path having the smallest path metric value, is selected, and a codeword corresponding to the corresponding path is determined as the final output value. This may be expressed mathematically as shown in the following expression.

$$\min_s M_N(s) \quad (2)$$

When describing FIG. 7 as an example, paths to reach each of the states 00, 01, 10, 11 at the last time instance N and path metrics $M_N(00)$ 705, $M_N(01)$ 710, $M_N(10)$ 715, and $M_N(11)$ 720 corresponding thereto are determined. Assuming that $M_N(01)$ 710 has the lowest value among the four path metrics, the decoder outputs a decoding result based on the output values corresponding to the branches along the path to reach state 01 at time instance N.

As previously described with reference to FIGS. 5 through 7, in Viterbi decoding, when multiple paths are merged to one state at a specific time instance, the decoder selects only one of the path to perform a path search. During this process, when the reliability of the transitions occurring at a particular bit index is low, the probability of the accurate path may be calculated to be low in reality. This signifies that the possibility that accurate path selection is not made increases and the decoding performance may be degraded accordingly. To address performance degradation that may occur in Viterbi decoding, the LVA decoding method is used.

Figure 8:
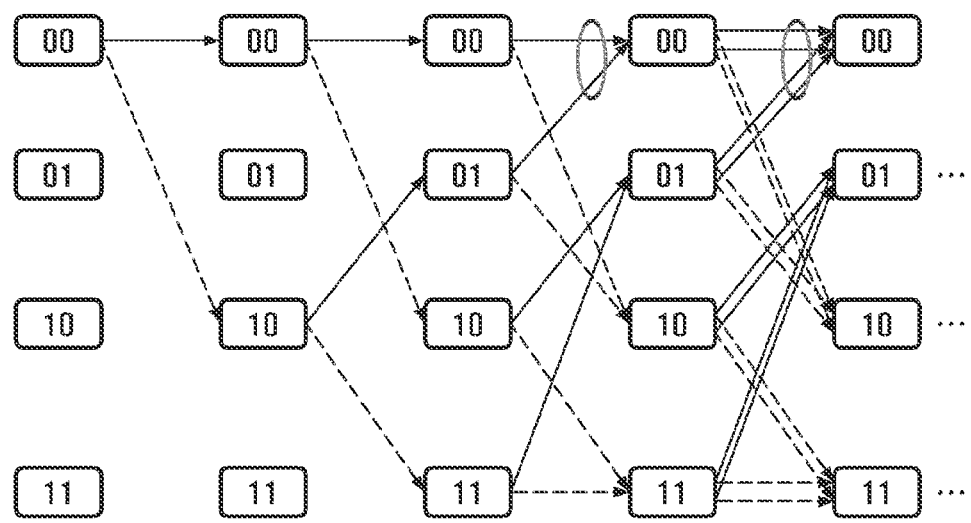
FIG. 8 illustrates a list Viterbi algorithm (LVA) decoding method according to an embodiment.

FIG. 8 illustrates an LVA decoding scheme according to an embodiment.

Referring to FIG. 8, in existing Viterbi decoding, when multiple paths are merged to one state, only one path is selected, whereas in LVA, when multiple paths are merged to one state, path search is performed by selecting up to a predetermined number ($L_s$) of paths instead of one path. Here, $L_s$ is a positive integer greater than 1, which may be a predetermined fixed value. When the number of states of paths merged to one state is greater than $L_s$, up to $L_s$ paths are selected in the order of a path having a higher probability of transition occurring first (i.e., in the ascending order of path metric values). The selected path is called an active path.

FIG. 8 shows an example of $L_s=2$. At time instance (t−1), two paths are merged to state "00". The two paths merged to state "00" at time instance (t−1) are $00 \to 00 \to 00 \to 00 \to 00$ and $00 \to 10 \to 01 \to 00$. Viterbi decoding selects only one of the two merged paths, whereas LVA decoding selects both of two paths and proceeds with path search. Similarly, in FIG. 8, at time instance (t−1), two paths are merged to each of states "01", "10", and "11", and in the LVA decoding, two paths that are merged to each state are selected.

At time instance (t−1), each state may have two paths and therefore, in state 00 at the next time instance t, a total of four paths may be merged. These four paths are $00 \to 00 \to 00 \to 00 \to 00 \to 00$, $00 \to 10 \to 01 \to 00 \to 00$, $00 \to 00 \to 10 \to 01 \to 00$, and $00 \to 10 \to 11 \to 01 \to 00$. In FIG. 8, since $L_s=2$, the two paths with the smaller path metric values among the four paths that are merged at time instance t are selected and thereafter path search proceeds in the same manner.

In Viterbi decoding, since only one path is selected for a state at a specific time instance, the path metric for a state s at time instance t may be defined by $M_t(s)$, which has t and s as variables, as shown in Equation 1. However, in LVA decoding, since up to $L_s$ paths are selected for a state at a specific time instance, it is necessary to define up to $L_s$ path metrics for a state s at time instance t. Therefore, the path metric for the k-th path ($1 \le k \le L_s$) in the states of time instance t may be defined as shown below in Equation (3) below.

$$M_t(s, k) = \min_{\substack{s' \in S_t^{(s)} \\ 1 \le \ell \le L_s}}{}^{(k)} \{M_{t-1}(s', \ell) + \mu_t(y_t, \hat{v}^{(s' \to s)})\} \quad (3)$$

In Equation (3), $M_{t-1}(s', \ell)$ is the maximum $L_s$ path metrics of the states' at time instance (t−1), and $\mu_t(y_t, \hat{v}^{(s' \to s)})$ is the branch metric representing a transition from the state s' to the state s at time t. $\min^{(k)}$ denotes the k-th minimum value. In LVA decoding, the path search is proceeded while maintaining $L_s$ paths instead of one path for each state, and a codeword corresponding to a path with the highest probability among the paths reached at the last time instance is determined as the output value of the final output, similar to Viterbi decoding.

Unlike Fano decoding, LVA decoding for PAC codes supports constant decoding throughput regardless of SNR. As illustrated in FIG. 8, in an application of LVA, the code graph of PAC codes may be represented by a trellis having (N+1) stages, and at each stage i=0,1, . . . , N, the decoder considers possible transitions between states and scores them according to a selected metric. i=0 corresponds to the initial storage value of the memory unit of the convolutional transform. Among the multiple arrival branches, the decoder repeats the same procedure while maintaining the $L_s$ most likely paths. This procedure ends at i=N, and the decoder outputs a codeword based on the path corresponding to the minimum (or maximum) metric.

However, when decoding PAC codes by using LVA, a potential path merging problem may occur due to the irregular characteristics of the trellis of the PAC codes, resulting in performance degradation. For example, only a transition occurring by 0 is allowed for a frozen index. That is, since the paths do not branch, the paths tend to toward a specific subset of states. When the decoder maintains $L_s$ paths for each state, the total number of active paths may be significantly reduced after path pruning. This phenomenon becomes more noticeable when many frozen indices are placed between two adjacent information indices. For example, after m consecutive frozen indices, all paths will all reach state 0.

Figure 9:
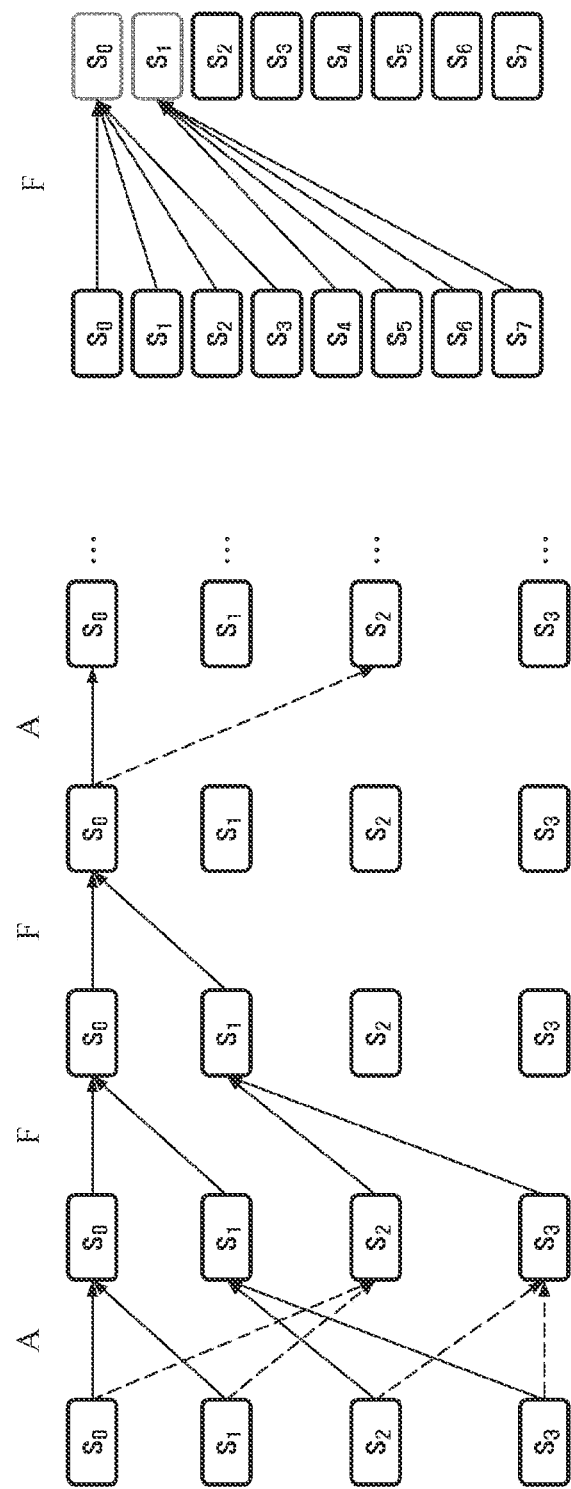
FIG. 9 illustrates a phat-merging phenomenon that may occur in LVA decoding according to an embodiment.

FIG. 9 illustrates a phat-merging phenomenon that may occur in LVA decoding according to an embodiment.

As described with reference to FIG. 3, in the PAC-based coding, a frozen bit is generated through a rate profile. The frozen bit is input as a fixed bit value (e.g., 0) at a predetermined index position. In a tree structure or trellis structure, branches are generated to branch off according to the input bit, such that if a fixed bit value of "0" is input, such as a frozen bit, only one branch corresponding to the corresponding "0" is generated, and the path is also limited to transitions by 0. In a trellis structure, when movement by frozen bits occurs repeatedly, the path may tend to concentrate in a few specific states during the search progresses. This is referred to as the path merging phenomenon. In FIG. 9, as a total of 8 paths of $s_0$, $s_1$, $s_2$ and $s_3$ passing through the first information bit A are limited as they pass through the first frozen bit F, and thus it is evident that the paths do not proceed to $s_2$ and $s_3$ but only proceeds to $s_0$ and $s_1$. Subsequently, after passing through the second frozen bit F, the paths do not proceed to $s_1$ $s_2$ and $s_3$ but all proceeds to $s_0$ As such, in the PAC-based coding, since the path is limited by the frozen bit, as the path search progresses, the path tends to direct to a few specific states and not proceed to the remaining states.

LVA decoding proceeds with a path search while selecting only a pre-fixed number ($L_s$) of paths even if many paths are merged to a specific state. In other words, the remaining paths except for the selected $L_s$ paths are discarded. Therefore, the more paths are merged to a few states, the more paths are discarded. For example, when $L_s$=2 and if 8 paths, including two paths proceeding to each of $s_0$, $s_1$, $s_2$, and $s_3$ in a specific time instance, a total of 8 paths, including two paths for each state, may all be selected and path search to the next time instance may proceed. Since a maximum of only two paths may be selected for each state, when 8 paths are concentrated in a specific time instance such that four paths are concentrated in each of s0 and s1, only a total of four paths, including two paths for each of s0 and s1, are selected and the remaining paths except the selected paths are discarded in subsequent path search. As such, although LVA decoding provides constant throughput, there is a path merging phenomenon in which the paths are concentrated in a specific state for the frozen index of a binary trellis, resulting in increasing the likelihood that the LVA discards the accurate path during search. The number of discarded paths increases as the paths in the LVA are concentrated in a specific few number of states, which signifies that the probability of discarding the accurate path is increased and the performance of the decoding is degraded accordingly.

To address these problems, disclosed is a method of integrating a dynamic list size adjustment function into LVA. The PAC codes under dynamic LVA as disclosed herein are highly applicable in control channel standardization while achieving performance similar to Fano decoding.

The path merging phenomenon that occurs in LVA decoding is due to only a fixed number of paths, $L_s$ being selected for each state, even if the paths are concentrated in a few number of states. This path merging phenomenon may be solved by allowing a number of paths greater than $L_s$ to be selected by the few number of states when the paths are concentrated in the few number of states during the path search process. As a method of solving path merging phenomenon of LVA decoding, disclosed herein is a dynamic-LVA (D-LVA) that dynamically adjusts the number of selectable paths for each state so that the total number of paths is maintained even when paths are concentrated in the few number of states. The D-LVA decoding disclosed herein is a method of decoding PAC codes that achieves nearly optimal performance and maintains a constant throughput, wherein the PAC code using D-LVA is superior to the polar code and has performance very close to the meta-converse bound, which is the lower bound of BLER in a finite block-length regime.

Figure 10:
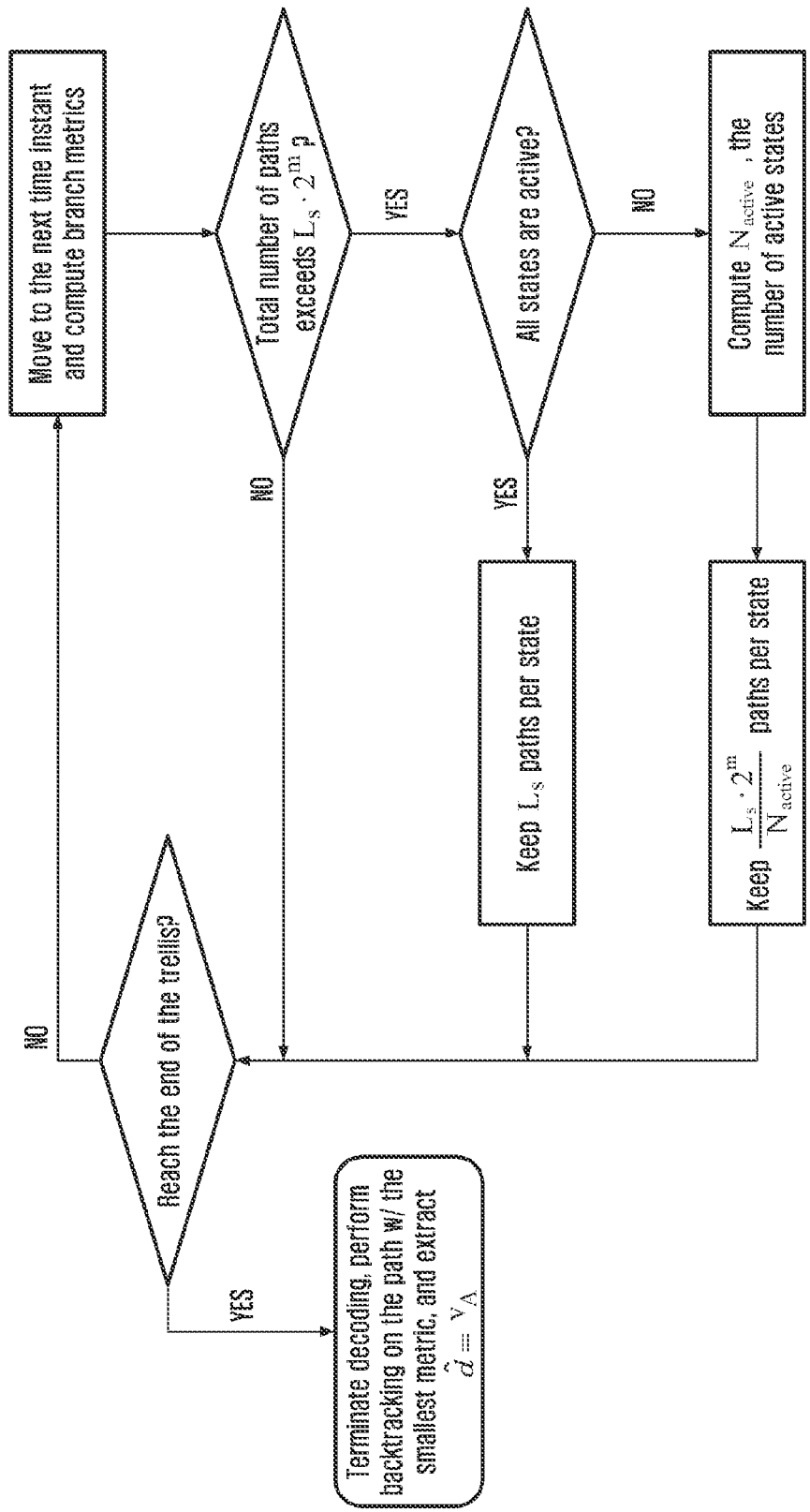
FIG. 10 illustrates D-LVA decoding according to an embodiment.

FIG. 10 illustrates D-LVA decoding according to an embodiment.

Upon receiving a signal encoded based on PAC coding from a transmitter, a receiver may perform decoding thereof by performing a path search based on a trellis structure associated with the PAC codes by using a decoder. Here, the decoder calculates a branch metric for each transition to proceed the path from each time instance to the next time instance and calculates a path metric based on the accumulated sum of the branch metrics, so as to search paths that can be proceeded. The problem caused by the path merging phenomenon is that there is a possibility that the accurate path is discarded during the path selection process. If the total number of paths does not exceed $L_s*2^m$, path selection does not need to be performed, and thus all paths are stored in each state and proceed path search to the next time instance. Here, m is the number of memory units and $2^m$ is the number of possible total states.

If the number of all paths is greater than $L_s*2^m$, the decoder determines whether all $2^m$ states are active states. The active state refers to a state that has at least one branch from the previous time instance, or that has at least one branch to the next time instance. For example, in FIG. 9, after the first frozen bit, $s_0$ and $s_1$ are active states and $s_2$ and $s_3$ are inactive states. In addition, after the second frozen bit, so is an active state and $s_1$, $s_2$, $s_3$ are inactive states.

If it is determined that all the states are active states, the path has progressed to all the states, and this signifies that no concentration due to path merging phenomenon has occurred. Therefore, the decoder may allocate and store up to $L_s$ paths for each state, in the same manner as the LVA. For example, if $L_s$=2 and all four states are active states, the four active states may each maintain $L_s$=2 paths. Thereafter, path search proceeds to the next time instance.

If it is determined that at least one state is not an active state, i.e., only some of the entire states are active, this signifies that concentration due to the path merging phenomenon has occurred. As such, when only some states are active states, the decoder may dynamically assign a path to each active state. In this case, the number of paths assigned to each state may be determined by considering the number of active states within the range that the total number of paths does not exceed $L_s*2^m$, and the same or different number of paths may be assigned to each state. In other words, when $\mathcal{L}_t^{(i)}$ is the number of paths assigned to a state $s_t(t \in \{1, \ldots, 2^m\})$ at the i-th time instance, the decoder dynamically assigns paths to each active state within the range that satisfies the following Equation (4).

$$\sum_{t=1}^{2^m} \mathcal{L}_t^{(i+1)} \leq 2^m \cdot L_s \quad (4)$$

Herein, when fewer than all states are active states, i.e., there is at least one inactive state, it should be noted that no path is assigned to the inactive state, a specific state may be assigned more paths than $L_s$, and other specific states may be assigned fewer paths than $L_s$. In other words, each state may be assigned a dynamically adjustable number of paths rather than a predetermined number of Ls.

As an example of a method of dynamically assigning paths, each active state may be uniformly assigned $$\frac{L_s \times 2^m}{N_{active}}$$

paths instead of $L_s$. $N_{active}$ denotes the number of active states. For example, when $L_s=2$ and only two of the total four states are active states, the two active states may each be assigned 2*4/2=4 paths instead of $L_s=2$. As another example, when $L_s=2$ and only one of the total four states is an active state, the corresponding one active state may be assigned 2*4/1=8 paths.

$$\frac{L_s \times 2^m}{N_{active}},$$

which is the number of paths capable of maintaining each active state, may be used in combination with other functions as needed. For example, if $$\frac{L_s \times 2^m}{N_{active}}$$

is not an integer value, a ceiling or floor function may be combined and used to maintain an integer value while not exceeding $L_s*2^m$.

As another example of a method of dynamically allocating paths, when only some states among all states are active states, a different number of paths may be assigned to each active state. For example, the number of paths reached for each active state at a specific time instance may be different, and the number of paths that can be assigned to each active state may be determined differently by considering the number of paths reached for each active state. For example, when $L_s=2$ and only two of four states are active state, it is possible that one active state among the two active states is assigned 6 paths and the other active state is assigned 2 paths.

Dynamic path allocation considering the active state in the trellis structure is performed repeatedly until the path reaches the last index of the trellis structure. When the path reaches the end of the trellis structure, a decoding result is output based on the output values of the branches along the path corresponding to the smallest path metric value.

Unlike the existing LVA decoding capable of maintaining only a fixed $L_s$ paths for each state regardless of the number of active states, the D-LVA decoding as disclosed herein is capable of, when only some states are active states, dynamically assigning a path having more or less specific active states than $L_s$ by considering the number of active states. Therefore, even if path merging occurs where paths are concentrated in a specific state due to frozen bits, the number of discarded paths can be minimized compared to the existing LVA decoding, thereby increasing the possibility of maintaining the accurate path during the path search process.

Figure 11:
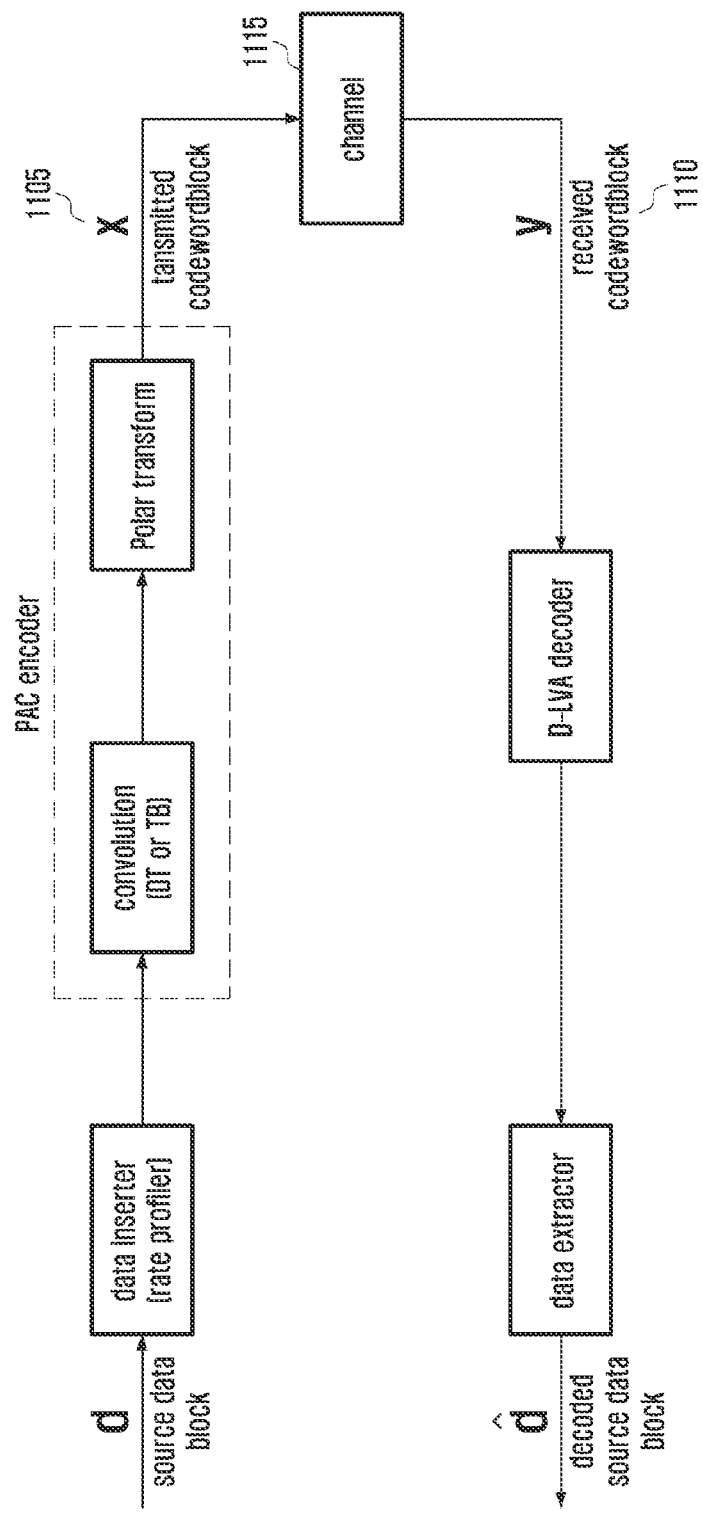
FIG. 11 illustrates a signal transmission and reception process of a transmitter and receiver according to an embodiment.

FIG. 11 illustrates a signal transmission and reception process between a transmitter and a receiver according to an embodiment.

Referring to FIG. 11, the transmitter generates a transmission codeword block x 1105 by encoding, based on the PAC code, a source data block d which is to be transmitted. The process of generating the transmission codeword block x 1105 from the source data block d based on the PAC code has been previously described with reference to FIG. 3, so detailed description will be omitted. The generated codeword block x 1105 is received, by the receiver through a channel 1115, as a receiving codeword block y 1110. The receiver performs decoding on the received codeword block y 1110 based on the D-LVA method as described above and accordingly, may estimate $\hat{d}$, which is the estimated value of the source data block transmitted by the transmitter.

The following provides a method for improving the performance of LVA decoding or D-LVA decoding in a PAC code including a CRC bit.

Generally, in the encoding process, a parity bit for CRC may be included along with the information bits. CRC is a bit value used to identify, when data is transmitted, whether there is an error in the transmitted data. The transmitter may, according to the value of the data to be transmitted, add the CRC value to the data and transmits the same together, and the receiver may identify the received CRC value to identify whether errors have occurred due to noise and the like during the data transmission process. Hereinafter, a parity bit or CRC bit represents a bit that is added to the data and transmitted to perform CRC, and a parity check or CRC check refers to detecting whether an error occurs by using the parity bit or CRC bit.

CRC codes are linear block codes that may be used in various transmission applications for error detection. The CRC code may be used in serial connection with the PAC code by performing CRC encoding on the data block and then inputting the same to the PAC encoder. As a result of CRC encoding, a $K_{CRC}$ bit may be added to the end of the data block. Since the $K_{CRC}$ bits added as a result of CRC encoding depend on almost all data blocks, the decoder should wait until all information bits of the data block are decoded to perform CRC check on the $KC_RC$ bits.

Figure 12:
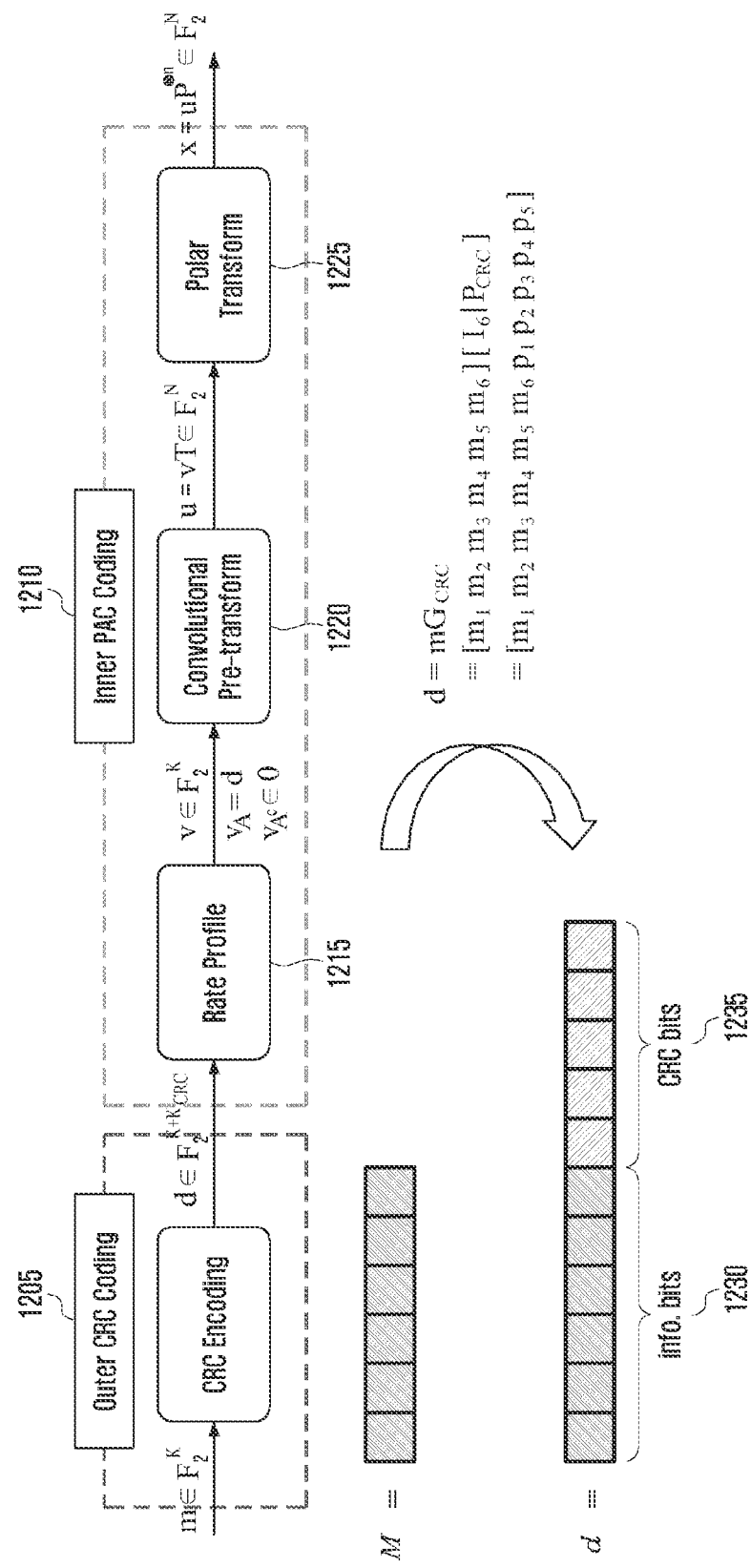
FIG. 12 illustrates an encoding method based on a PAC code including cyclic redundancy check (CRC) bits according to an embodiment.

FIG. 12 illustrates an encoding method based on a PAC code including a CRC bit according to an embodiment.

Referring to FIG. 12, it is evident that outer CRC encoding 1205 is performed to add CRC bits before performing inner PAC coding 1210 described with reference to FIG. 3. In FIG. 12, m is an information bit to be transmitted by a transmitter and has a length of K bits. The information bits 1230 of length K are added with CRC bits 1235 as many as $K_{CRC}$ bits 1235 through CRC encoding, and as a result, a total of (K+$K_{CRC}$) bits are generated and input to the PAC encoder. Subsequent PAC encoding process using the PAC encoder is the same as previously described with reference to FIG. 3. Specifically, (K+$K_{CRC}$)-length bits including an information bit and a CRC bit are subjected to a rate profile 1215 to obtain v∈ $\mathbb{F}_2^N$ of length N. The v obtained by the rate profile 1215 consists of $v_\mathcal{A}$ corresponding to (K+$K_{CRC}$)-length d with information bits 1230 appended with CRC bits 1235, and $v_{\mathcal{A}^c}$ (or $v_{\mathcal{F}}$ corresponding to the frozen bits generated during the rate profile 1215 process, where the location and value (e.g., 0) of the frozen bits are assumed to be known by both the transmitter and receiver. Furthermore, by applying a convolutional pre-transform 1220 to the output v of the rate profile 1215, $u=vT \in \mathbb{F}_2^N$ is obtained for the topology matrix T, and by applying a polar transform 1225 to the corresponding u, a codeword $x=uP^{\oplus n} \in \mathbb{F}_2^N$ of length N is finally output.

In CRC encoding, the matrix $G_{CRC}$ that generates $(K+K_{CRC})$-length bits including CRC bits 1235 from the information bit m of length K is called a generator matrix. The output d of the CRC encoder may be generated as $d=mG_{CRC}$. Since CRC encoding is a process of adding only parity bits to information bits 1230 without changing the information bits 1230, the generator matrix $G_{CRC}$ may be configured by an identity matrix $I_K$, which outputs the input information bits 1230 as they are, and the $P_{CRC}$, which generates and outputs parity bits based on the information bits 1230. That is, $G_{CRC}=[I_K|P_{CRC}]$. When information bit m is multiplied by the generator matrix $G_{CRC}$, information bit m of length K is generated through $I_K$ in $G_{CRC}$, $K_{CRC}$-length parity bits are generated through $P_{CRC}$ in $G_{CRC}$, and finally $(K+K_{CRC})$ bits are output.

In FIG. 12, it is evident that parity bits $[p_1\ p_2\ p_3\ p_4\ p_5]$ having a length of $K_{CRC}=5$ are inserted into information bits $m=[m_1\ m_2\ m_3\ m_4\ m_5\ m_6]$ having a length of K=6, resulting in bits $[m_1\ m_2\ m_3\ m_4\ m_5\ m_6\ p_1\ p_2\ p_3\ p_4\ p_5]$ having a total length of $(K+KC_{RC})=11$. As an example for explanation, it is assumed that $P_{CRC}$ and $G_{CRC}$ are defined as follows for the information bit m having a length of 6. However, the scope of the disclosure is not limited thereto.

$$P_{CRC} = \begin{bmatrix} 1 & 1 & 0 & 0 & 1 \\ 1 & 0 & 1 & 0 & 1 \\ 1 & 0 & 0 & 1 & 1 \\ 1 & 0 & 0 & 0 & 0 \\ 0 & 1 & 1 & 0 & 0 \\ 0 & 0 & 0 & 0 & 0 \end{bmatrix}$$

$$G_{CRC} = [I_6 | P_{CRC}] = \begin{bmatrix} 1 & 0 & 0 & 0 & 0 & 0 & 1 & 1 & 0 & 0 & 1 \\ 0 & 1 & 0 & 0 & 0 & 0 & 1 & 0 & 1 & 0 & 1 \\ 0 & 0 & 1 & 0 & 0 & 0 & 1 & 0 & 0 & 1 & 1 \\ 0 & 0 & 0 & 1 & 0 & 0 & 1 & 0 & 0 & 0 & 0 \\ 0 & 0 & 0 & 0 & 1 & 0 & 0 & 1 & 1 & 0 & 0 \\ 0 & 0 & 0 & 0 & 0 & 1 & 0 & 0 & 0 & 0 & 0 \end{bmatrix}$$

When $G_{CRC}$ and $P_{CRC}$ are defined as above, parity bits $[p_1\ p_2\ p_3\ p_4\ p_5]$ may be determined through $m \times P_{CRC}$ based on $m=[m_1\ m_2\ m_3\ m_4\ m_5\ m_6]$ and $P_{CRC}$. Thus, 5 parity bits each are determined based on most of the six information bits. For example, $p_1$ depends on $m_1$, $m_2$, $m_3$, and $m_4$, $P_2$ depends on $m_1$ and $m_5$, ..., and $p_5$ depends on $m_1$, $m_2$, and $m_3$. In other words, since $p_1$ requires information about the four information bits $m_1$, $m_2$, $m_3$, and $m_4$, the parity check for $p_1$ may be performed only when decoding of all of $m_1$, $m_2$, $m_3$, and $m_4$ is completed, even though $p_1$ is the first parity bit. Likewise, since the second parity bit $p_2$ requires information about $m_1$ and $m_5$, even though $p_2$ is the second parity bit, the parity check for $p_2$ may be performed only when decoding of $m_1$ and $m_5$ is completed. As such, when parity bits are generated based on the generator function $G_{CRC}$ that simply concatenates $P_{CRC}$ to the identity matrix I, not only are parity bits inserted after information bits, but also, most of the information bits are needed for parity check for each parity bit. Therefore, a parity check for error detection may be performed only after decoding of all information bits is completed.

The disclosure aims, to improve the above inefficiency, a method of transforming the generator matrix $G_{CRC}$ so that each parity bit depends only on a bit value for which decoding has previously completed without impairing the error detection function using the parity bit, generating parity bits based on the transformed generator matrix $G_{D\text{-}CRC}$, and applying the parity bits to LVA decoding or D-LVA decoding.

Figure 13:
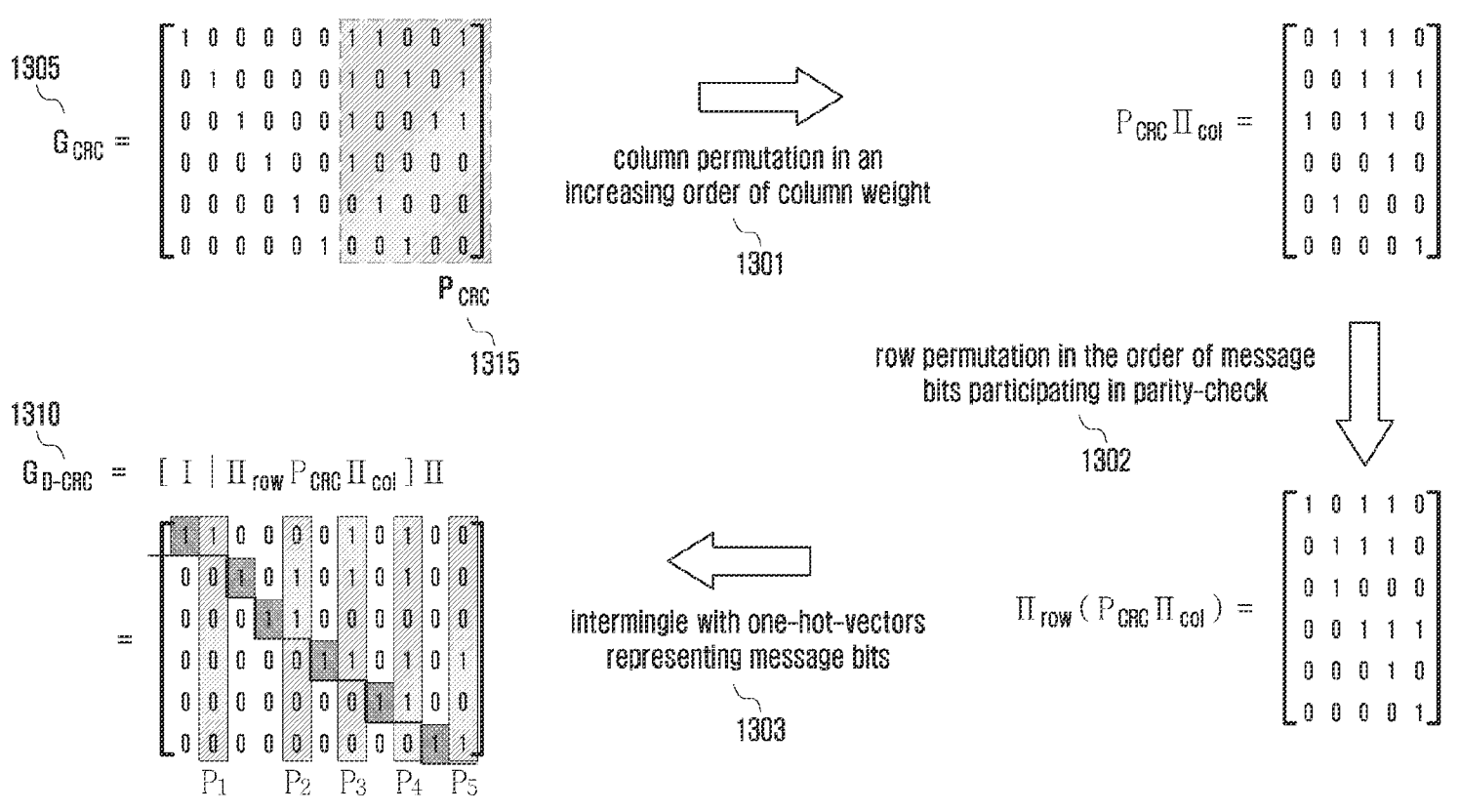

FIG. 13 illustrates an example of a process for determining $G_{D\text{-}CRC}$ from the generator function $G_{CRC}$ for CRC encoding according to an embodiment.

$G_{D\text{-}CRC}$ 1310 is a matrix determined through transform of $G_{CRC}$ 1305 and is determined so that each parity bit depends only on the bit value for which decoding has previously completed. This transform may be achieved through column permutation 1301 and row permutation 1302 of the $P_{CRC}$ 1315 matrix and intermingle 1303 with the identity matrix I to generate information bits. Column permutation refers to rearranging the columns using column weights defined based on the number of is in the column, row permutation refers to rearranging the rows according to the order of the information bits participating in the CRC check and intermingle refers to mixing the $P_{CRC}$1315 on which the column permutation and row permutation have been performed with an identity matrix for generating the information bits. The generator matrix $G_{CRC}$ 1305 transformed through the column permutation, row permutation, and intermingle is referred to as $G_{D\text{-}CRC}$ 1310.

As shown in FIG. 13, according to the transformed generator matrix $G_{D\text{-}CRC}$ 1310, the parity bit is generated to depend only on the bit value for which decoding has previously completed. For example, according to the $G_{D\text{-}CRC}$ 1310 of FIG. 13, it is evident that $p_1$ depends only on $m_1$, in which decoding occurs before $p_1$, $p_2$ depends only on $m_2$ and $m_3$, in which decoding occurs before $p_2$, and $p_3$ depends on $m_1$, $m_2$, and $m_4$, in which decoding occurs before $p_3$. Additionally, according to the transformed generator matrix $G_{D\text{-}CRC}$ 1310, the parity bits may not be added to the end of the information bits but may be distributed and inserted in the middle of the information bits. As such, if the parity bits are distributed and inserted in the middle of the information bits, and the parity bits inserted in the middle depend only on the bit value for which decoding has previously completed, it is possible to perform a parity check in the middle of the decoding process by using each parity bit even before decoding of all information bits is completed.

Figure 14:
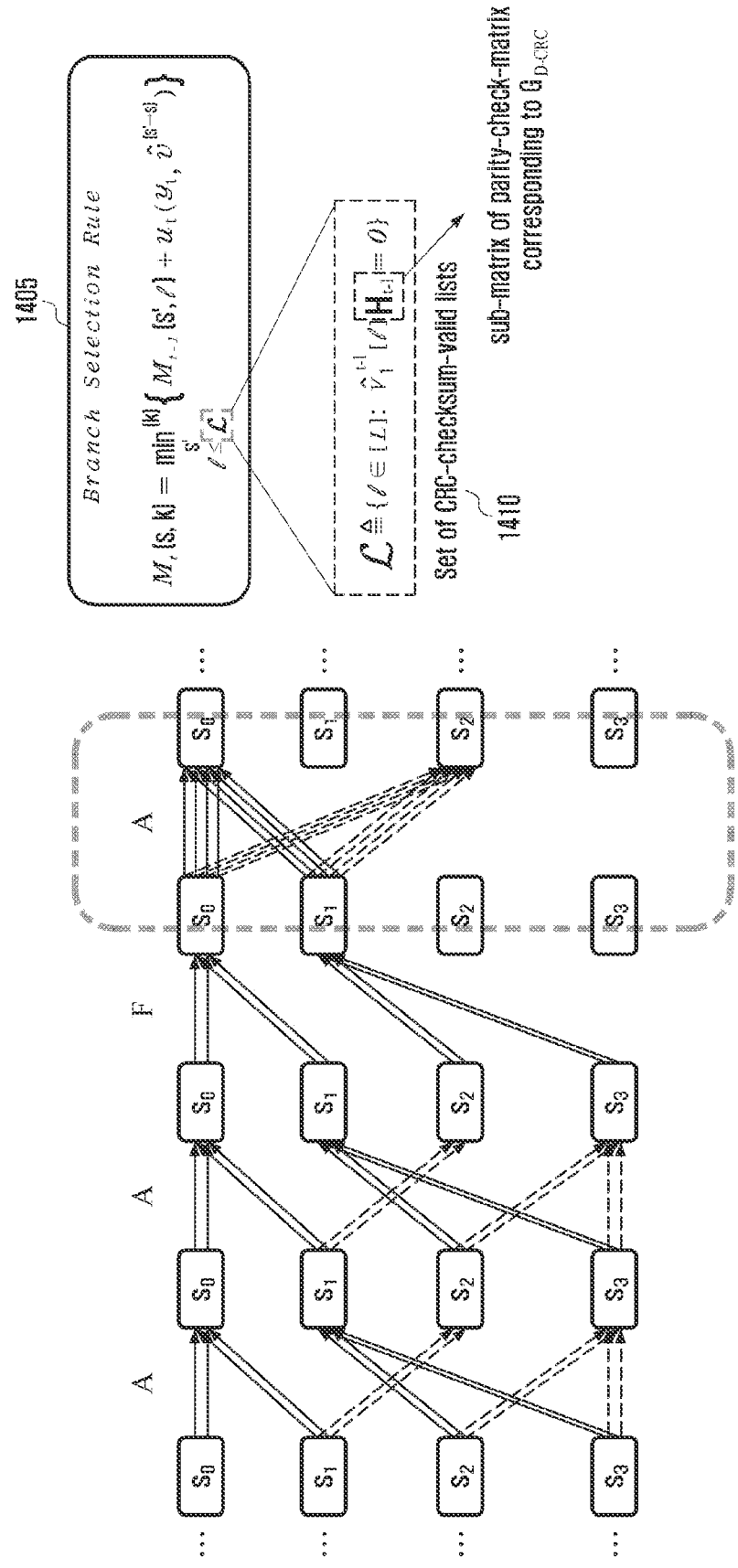
FIG. 14 illustrates a method for decoding a PAC code including CRC bits according to an embodiment.

FIG. 14 illustrates a method for decoding a PAC code including a CRC bit according to an embodiment.

The decoder may receive a signal encoded based on a PAC code including a CRC bit and may perform decoding through path search for the trellis structure to LVA decoding or D-LVA decoding. In this case, not only the information bits but also the CRC bits for CRC check are included in A. As shown in FIG. 14, the CRC bits may not be attached to the end of the information bits but may be distributed and inserted in the middle thereof. That is, the decoder may perform path search at a time instance corresponding to the CRC bit during path search before completing decoding of all information bits.

If the CRC bit depends on almost all information bits as in the prior art, the CRC bit also depends on information bits that have not yet been determined along the path, and thus it is not possible to perform a CRC check using the corresponding CRC bit. However, when the CRC bit only depends on the information bit for which decoding has previously completed, the CRC bit only depends on bits that have already been determined along the path to reach the CRC bit, and therefore, when performing path search at the time instance corresponding to the CRC bit, it is possible to perform a CRC check based on the CRC bit and bits determined at the previous time instance.

Therefore, when performing a path search at a time instance corresponding to a CRC bit, the decoder may not perform a search on all paths but may only perform a search on paths where the CRC check result using the corresponding CRC bit is valid.

Referring to FIG. 14, when a specific CRC bit corresponds to a time instance t, the path metric for the k-th path ($1 \leq k \leq L_s$) in a state s of the corresponding time instance t may be defined in a branch selection rule 1405 as shown below in Equation (5) instead of Equation (3).

$$M_t(s, k) = \min_{\substack{s' \\ \ell \in \mathcal{L}}}{}^{(k)} \{M_{t-1}(s', \ell) + \mu_t(y_t, \hat{v}^{(s' \to s)})\} \quad (5)$$

In Equation (5), $\mathcal{L}$ is a set of paths where the CRC check result using the CRC bit corresponding to time instance t is valid, and is defined in a set of CRC-checksum-valid lists 1410 as shown in the following Equation (6) based on the sub-matrix $H_{t-1}$ of the CRC check matrix.

$$\mathcal{L} \triangleq \{\ell \in [L] : \hat{v}_1^{t-1}[\ell] H_{t-1} = 0\} \quad (6)$$

Equation (3) defines, as the path metric $M_t(s, k)$, the smallest k-th value among all the values calculated for $\ell$ satisfying $1 \geq \ell \geq L_s$, while Equation (5) defines, as the path metric $M_t(s, k)$, the smallest k-th value among the values calculated for $\ell$ included in a set of paths $\mathcal{L}$ for which the CRC check has been determined to be valid.

As such, at the time instance corresponding to the CRC bit, a path search is performed based on paths where the CRC check is valid. If all paths do not pass the CRC check, it is possible to return to the previous time instance and search for an alternative path. The CRC check using the CRC bit is repeated several times while the decoder searches the trellis and accordingly, the accurate path may be found more efficiently, resulting in improvement of decoding performance. In addition, the decoder may reduce latency by terminating decoding and requesting retransmission, even before decoding is completed, if all paths do not pass the CRC check.

In general, convolutional codes are stream-oriented codes and are transformed into code blocks used in packet-based communications. The PAC code has been first designed based on direct truncation encoding of convolutional codes, and truncates the bit sequence resulting from the convolutional transform block into blocks of length N. This simple method ensures rate-1 encoding in which the input bits and output bits have the same size, but the last m bits do not enjoy the same level of error protection as that of the previous bits.

Figure 15:
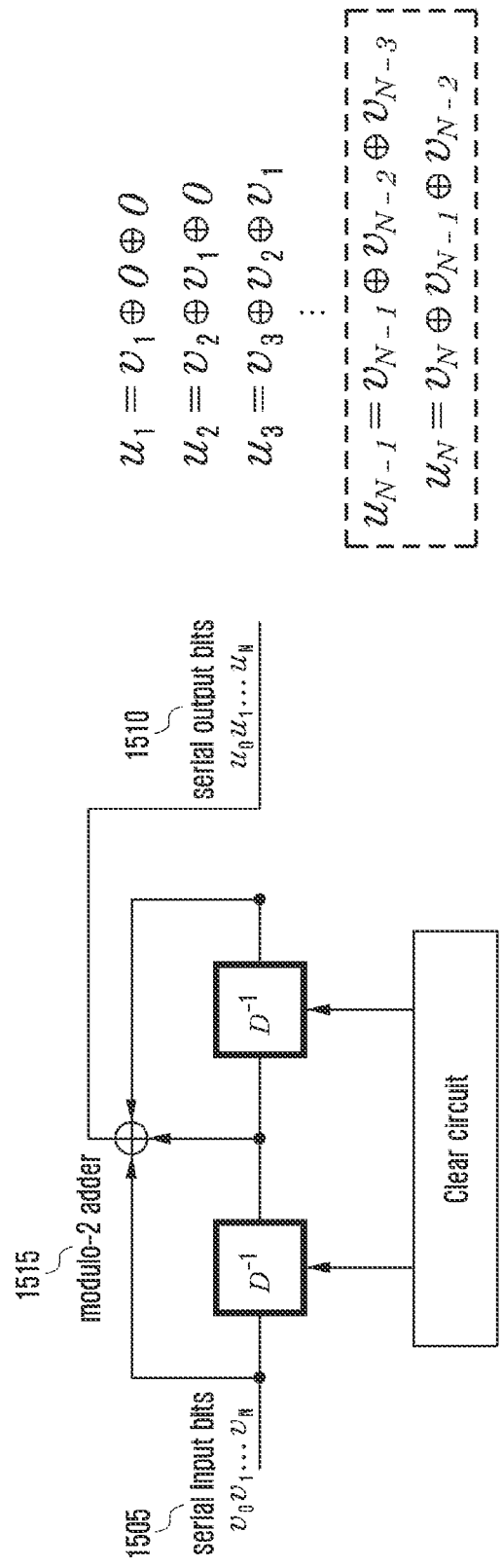
FIG. 15 illustrates an example of a direct-truncation (DT) convolutional code according to an embodiment.

FIG. 15 illustrates an example of a direct-truncation (DT) convolution code according to an embodiment.

Referring to FIG. 15, it is assumed that two memory units are used and the output bit is determined based on a convolution operation of the input bit and the bits stored in the memory unit. Additionally, it is assumed that encoding is performed with a code rate of 1 (Rate-1) where the length of the input bit sequence and the length of the output bit sequence are the same. FIG. 15 is only an example and the disclosure may be applied to other types of encoding.

An input bit sequence $v_1 v_2 \ldots v_N$ (1505) is sequentially input and stored in the memory unit. An output bit sequence $u_1 u_2 \ldots u_N$ (1510) may be output through modulo-2 operation 1515 of the input bits and the bits stored in the memory unit. In the structure shown in FIG. 15, the relationship between input bits and output bits may be expressed as shown below in Equation (7) below.

$$\begin{aligned} u_1 &= v_1 \oplus 0 \oplus 0 \\ u_2 &= v_2 \oplus v_1 \oplus 0 \\ u_3 &= v_3 \oplus v_2 \oplus v_1 \\ &\vdots \\ u_{N-1} &= v_{N-1} \oplus v_{N-2} \oplus v_{N-3} \\ u_N &= v_N \oplus v_{N-1} \oplus v_{N-2} \end{aligned} \quad (7)$$

In Equation (7), $v_1$ among the input bits is used to generate three output bits $u_1$, $u_2$, $u_3$. That is, $v_1$ has a correlation with three output bits. Likewise, $v_2$ has a correlation with the three output bits $u_2$, $u_3$, $u_4$, and $v_3$ has a correlation with the three output bits $u_3$, $u_4$, $u_5$. However, $v_{N-1}$ among the input bits has a correlation only with two output bits $u_{N-1}$, $u_N$, and $v_N$ has a correlation with only one output bit $u_N$. That is, the last m bits among the input bits (the last two bits in FIG. 15 have a correlation with fewer output bits compared to other input bits, which signifies that the last m bits do not enjoy the same error protection effect compared to the previous input bits.

This unevenness in the effectiveness of error protection may be solved through zero-tail encoding or tail-biting encoding. Zero-tail encoding adds m zeros to the data block to ensure that the trellis ends in the zero-state (a state in which all bits are 0). Tail-biting encoding ensures that the end state of the trellis is not necessarily the zero-state, but the initial state and the end state are always the same. This tail-biting encoding may be achieved by initializing the memory of the encoder with the last m information bits, or by appending the last m information bits before the data block. In particular, tail-biting encoding may ensure that all information bits have the same level of error correction effect without loss of a code rate.

Figure 16:
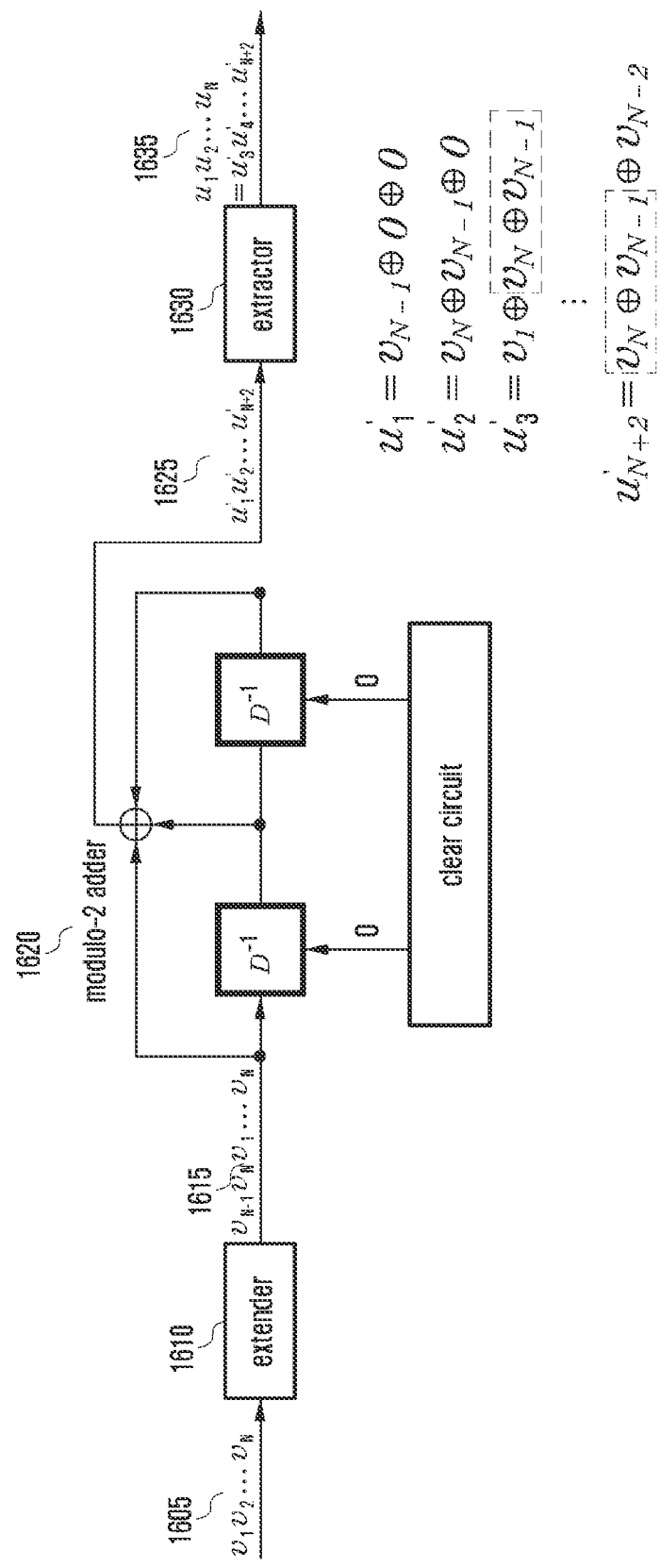
FIG. 16 illustrates an example of a tail-biting (TD) convolutional code according to an embodiment.

FIG. 16 illustrates an example of a TD convolution code according to an embodiment.

Referring to FIG. 16, an input bit sequence $v = v_1 v_2 \ldots v_N$ 1605 having a length of N is extended by an extender 1610 to an input bit sequence having a length of (N+m) by adding, by a modulo-2 adder 1620, the last m bits before the input bit sequence through an extender before being input to the memory unit of the encoder. Here, "m" may be the number of memory units of the convolutional encoder. The last m bits extended for the TB convolution code are referred to hereinafter as TB bits. In FIG. 16, the last two bits $v_{N-1} v_N$ are added before the input bit sequence $v = v_1 v_2 \ldots v_N$ 1605 through the extender 1610 and accordingly, an extended input bit sequence $v' = v_{N-1} v_N v_1 v_2 \ldots v_N$ 1615 having a length of (N+2) is input to the memory unit. The bit sequence u' 1625 generated by the extended input bit sequence v' may be expressed as shown below in Equation (8) below.

$$u'_1 = v_{N-1} \oplus 0 \oplus 0 \quad (8)$$

$$u'_2 = v_N \oplus v_{N-1} \oplus 0$$

$$u'_3 = v_1 \oplus v_N \oplus v_{N-1}$$

$$\vdots$$

$$u'_{N+1} = v_{N-1} \oplus v_{N-2} \oplus v_{N-3}$$

$$u'_{N+2} = v_N \oplus v_{N-1} \oplus v_{N-2}$$

In Equation (8), the encoder outputs a bit sequence $u'_3 u'_4 \ldots u'_N+2$ having a length of N, excluding the first two bits of u", as the final output bit sequence $u_1 u_2 \ldots u_N$ 1635 through an extractor 1630. Therefore, the relationship between the input bit sequence and the output bit sequence based on TB encoding may be finally expressed as shown below in Equation (9) below.

$$u_1 = v_1 \oplus v_N \oplus v_{N-1} \quad (9)$$

$$u_2 = v_2 \oplus v_1 \oplus v_N$$

$$u_3 = v_3 \oplus v_2 \oplus v_1$$

$$\vdots$$

$$u_{N-1} = v_{N-1} \oplus v_{N-2} \oplus v_{N-3}$$

$$u_N = v_N \oplus v_{N-1} \oplus v_{N-2}$$

In Equation (9), all input bits are correlated with three output bits each, and thus enjoy the same error protection effect.

When comparing Equation (7), which represents the output bit sequence according to direct truncation (DT) encoding, and Equation (9), which represents the output bit sequence according to TB encoding, it is evident that the TB bits corresponding to the last m bits of the input bit sequence are used in calculation of the first m output bits, instead of the initial value of 0 stored in the memory unit. That is, as shown in FIG. 16, adding m TB bits before the information bits and then extracting N bits again has the same effect as storing the initial value of the memory unit of the encoder as m TB bit values instead of 0. In particular, adding m TB bits before the information bits and then extracting N bits again, or storing the initial value of the memory unit as m TB bit values instead of 0, are all performed in the encoding process of the transmitter. Therefore, it should be noted that a method of implementing the TB convolutional code depends on the implementation of the transmitter, and the disclosure is applicable to any implementation method. The following description of the disclosure assumes that the initial value of the memory unit is stored as the m tail-byte bit values instead of zero for conciseness purposes.

The TB convolutional code described above with reference to FIG. 16 may be applied to the PAC code. Herein, this is referred to as a tail biting-PAC (TB-PAC) code.

Figure 17:
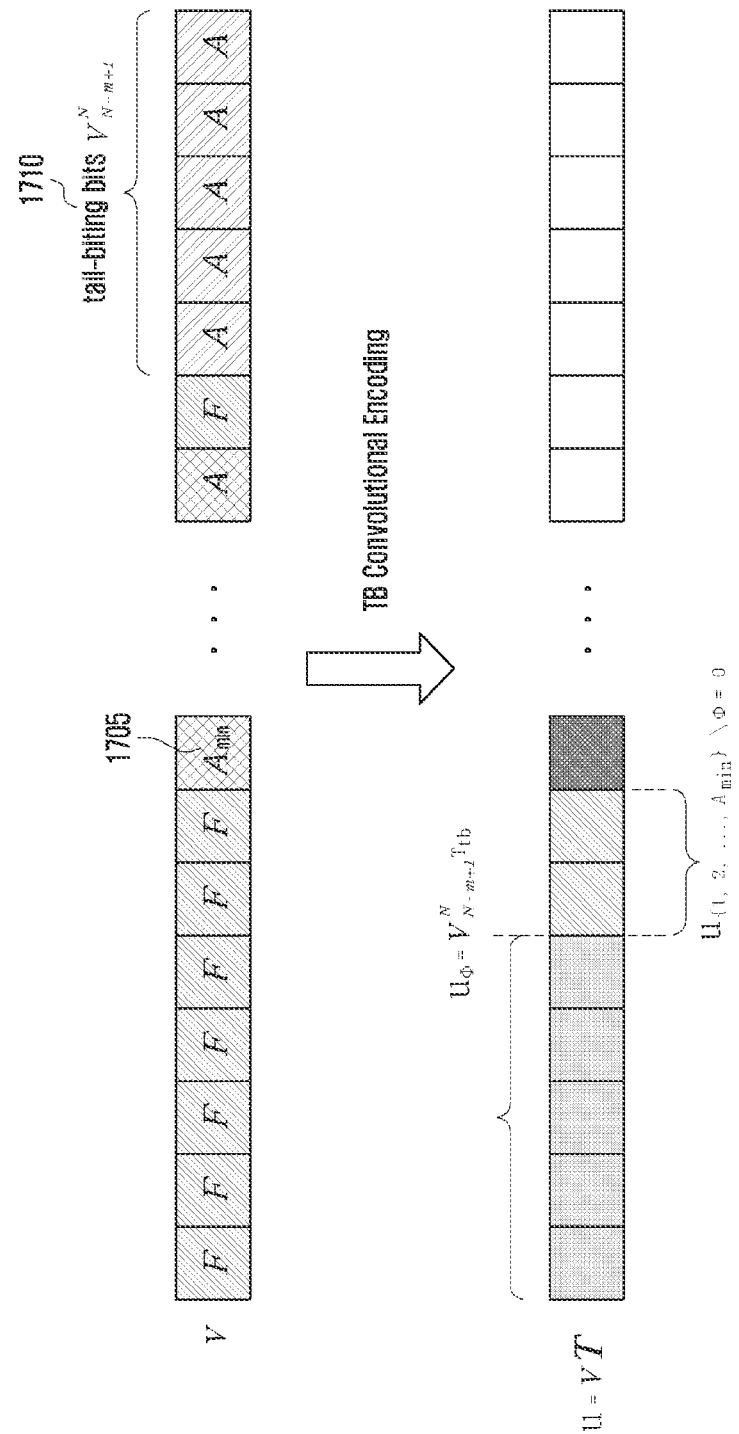
FIG. 17 illustrates an encoding method based on a TB-PAC code according to an embodiment.

FIG. 17 illustrates an encoding method based on a TB-PAC code according to an embodiment.

Similarly to the existing PAC code, the TB-PAC code may generate a frozen bit F and an information bit A through a rate-profile process. The frozen bit F may have a predetermined bit value, for example, a bit value of 0. A case in which $\mathcal{A}_{min}$ 1705 is referred to as the earliest index in the set of information bits $v_\mathcal{A}$, and m< $\mathcal{A}_{min}$ is satisfied for the number of TB bits, m, is considered. In the memory unit, m TB bits are stored as initial values.

As previously explained in reference to FIG. 16, according to the TB code, the first m output bit sequences $u_1^m$ are correlated with a TB bit sequence $v_{N-m+1}^N$ of length m. In this case, since m< $\mathcal{A}_{min}$ is assumed, the earliest information bit in the input bit sequence exists after at least the first m bits and has a bit value of 0, which is a frozen bit, until a bit of $\mathcal{A}_m$ in 1705 index. That is, the initial bit values of the input bit sequence are configured by m or more frozen bits. When the input bit sequence is sequentially input to the memory unit, m or more frozen bits 0 are input before the first information bit is input, and thus no information bits other than the frozen bit are input until the initial TB bits set in the memory unit are flushed through the frozen bits. Therefore, the first m output bit sequences $u_1^m$ depend only on the TB bit sequence $v_{N-m+1}^N$ (1710) and may be determined as shown below in Equation (10) below.

$$u_1^m = v_{N-m+1}^N T_{tb,m}, \quad (10)$$

In Equation (10), the generator matrix $T_{tb,m} \in \mathbb{F}_2^{m \times m}$ for TB encoding is a sub-matrix of $T_{tb} \in \mathbb{F}_2^{N \times N}$ where $T_{tb}$ is a circulant matrix.

As a method for decoding the TB-PAC code, LVA or D-LVA decoding may be applied.

The existing PAC code assumes that the initial value of the memory unit is always 0, and therefore the initial state of the trellis structure corresponding to the PAC code is always fixed as 0. However, in the case of the TB-PAC code, the initial value of the memory unit may not be 0 depending on the TB bit value. That is, the initial state of the trellis structure corresponding to the TB-PAC code may not be 0. The decoder is unable to know the TB bit value or the initial value of the memory unit, and thus the initial state of the trellis structure is unable to be known. In other words, from the viewpoint of the decoder, all states have the same probability of becoming the initial state. As such, the TB-PAC codes ensure that all bits enjoy the same error protection, but the decoder should also consider non-zero states as initial states.

Figure 18:
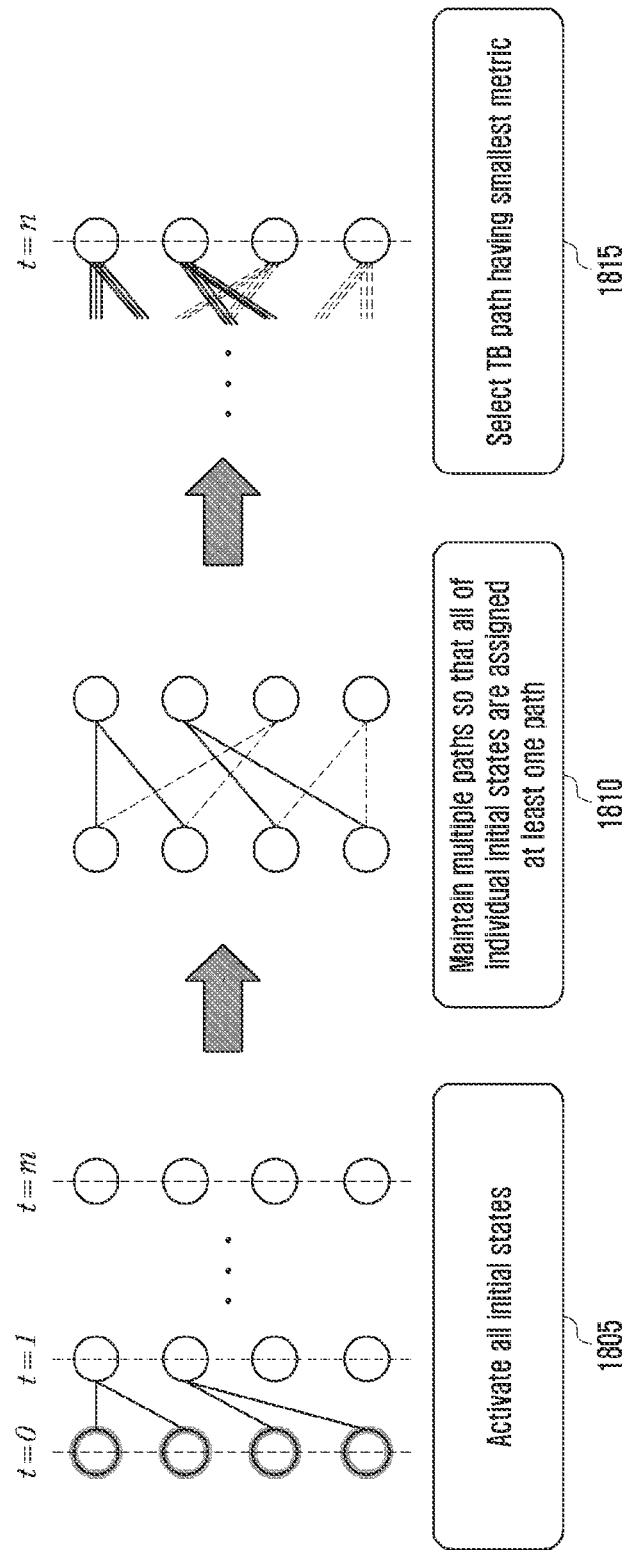
FIG. 18 illustrates a decoding method based on a tail-biting (TB) convolutional code according to an embodiment.

FIG. 18 illustrates a decoding method based on a TB convolutional code according to an embodiment.

Referring to FIG. 18, when using the TB-PAC code, the decoder searches the trellis by considering all $2^m$ states as possible initial states. That is, the decoder may perform path search by assuming that all initial states are active states. Thus, in step 1805, the decoder activates all initial states.

In this case, the last state of the trellis reached through the path search of the decoder corresponds to the last m TB bits of the input bit sequence. In addition, the initial state of the trellis corresponds to the initial value stored in the memory unit, and since it has been assumed that m TB bits are stored as initial values in the memory unit, the initial state also corresponds to m TB bits. Since both the last state and the initial state correspond to the same m TB bits, if the path is accurate when using the TB-PAC code, the condition that the last state on the path and the initial state on the path are the same should be satisfied. As such, the path in which the initial state and the final state are the same is called a TB path (TB path), and the accurate path should be a TB path.

In step 1810, to ensure the accuracy of path search, the decoder may assign a path such that each of all initial states maintains at least one path whenever path search is performed from each time instance to the next time instance.

For example, when selecting a path for each time instance, the decoder may assign a path to include at least one of a path that started in state $s_0$, a path that started in state $s_1$, . . . , and a path that started in state $s_2^m$. In this case, in step 1815, the at least one path may have the smallest metric among the paths that has started in each state and the decoder selects this TB path having the smallest metric. This constraint on path assignment to maintain at least one path for every initial state allows more TB paths to be maintained when the final state of the trellis is reached, and increases the possibility in which the decode selects an accurate path.

The D-LVA decoding method for dynamically assigning a path, the decoding method for a PAC code including a CRC bit, and the decoding method based on the TB-PAC code is disclosed herein to improve the decoding performance of the receiver, and may be used independently from each other.

Figure 19:
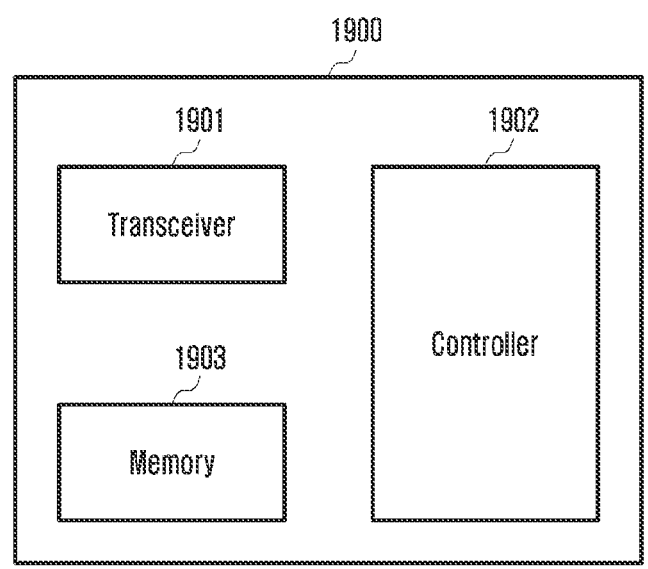
FIG. 19 is a block diagram illustrating the configuration of a receiver according to an embodiment.

FIG. 19 is a block diagram showing the configuration of a receiver according to an embodiment.

Referring to FIG. 19, a receiver 1900 may include a transceiver 1901, a controller (a processor) 1902, and a storage (a memory) 1903. However, the components of the receiver 1900 are not limited to the above-described examples. The receiver 1900 may include more or fewer components than the above-described components and may be implemented in the form of a single chip.

Alternatively, the transceiver 1901 may be configured by a transmitter and a receiver. The transceiver 1901 may transmit and receive signals to and from the transmitter. The signal may include control information and data. To this end, the transceiver 1901 may be configured by an RF transmitter that up-converts and amplifies the frequency of the transmitted signal, and an RF receiver that low-noise amplifies the received signal and down-converts the frequency. Additionally, the transceiver 1901 may receive a signal through a wireless channel, output the received signal to the controller 1902, and transmit the signal output from the controller 1902 through a wireless channel.

The controller 1902 may control a series of processes so that the receiver 1900 may operate according to the above-described embodiments. To this end, the controller 1902 may include at least one processor. For example, the controller 1902 may include a communication processor (CP) that performs control for communication and an application processor (AP) that controls higher layers such as application programs. Additionally, the controller 1902 may include a decoder which is capable of performing a D-LVA decoding method for dynamically assigning a path, a method for decoding a PAC code including a CRC bit, and a decoding method based on a TB-PAC code according to various embodiments of the disclosure. The decoder may be implemented as a single component that performs decoding according to various embodiments of the disclosure, or may be implemented as several independent components.

The storage 1903 may store control information, data, or information and data received from the transmitter, and may include areas for storing information or data required for control of the controller 1902 and information or data generated during control by the controller 1902. For example, the storage 1903 may store information required for the operation of a decoder included in the controller 1902.

Figure 20:
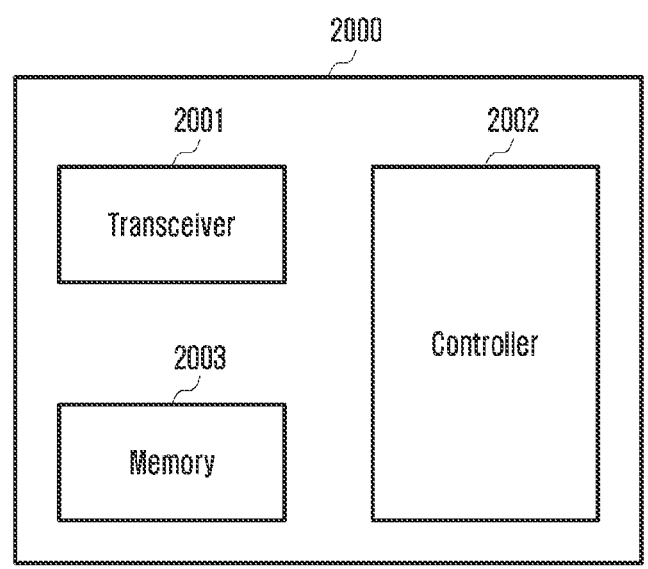
FIG. 20 is a block diagram illustrating the configuration of a transmitter according to an embodiment.

FIG. 20 is a block diagram showing the configuration of a transmitter according to an embodiment.

Referring to FIG. 20, a transmitter 2000 may include a transceiver 2001, a controller (a processor) 2002, and a storage (a memory) 2003. However, the components of the transmitter 2000 are not limited to the above-described examples. The transmitter 2000 may include more or fewer components than the above-described components and may be implemented in the form of a single chip.

Alternatively, the transceiver 2001 may be configured by a transmitter and a receiver. The transceiver 2001 may transmit and receive signals to and from a receiver. The signal may include control information and data. To this end, the transceiver 2001 may be configured by an RF transmitter that up-converts and amplifies the frequency of the transmitted signal, and an RF receiver that low-noise amplifies the received signal and down-converts the frequency. Additionally, the transceiver 2001 may receive a signal through a wireless channel, output the received signal to the controller 2002, and transmit the signal output from the controller 2002 through a wireless channel.

The controller 2002 may control a series of processes so that the transmitter 2000 may operate according to an embodiment of the disclosure. To this end, the controller 2002 may include at least one processor. For example, the controller 2002 may include a CP that performs control for communication and an AP that controls higher layers such as application programs.

The storage 2003 may store control information, data, or information and data to be transmitted to the receiver and may include areas for storing information or data required for control of the controller 2002 and information or data generated during control by the controller 2002.

Figure 21:
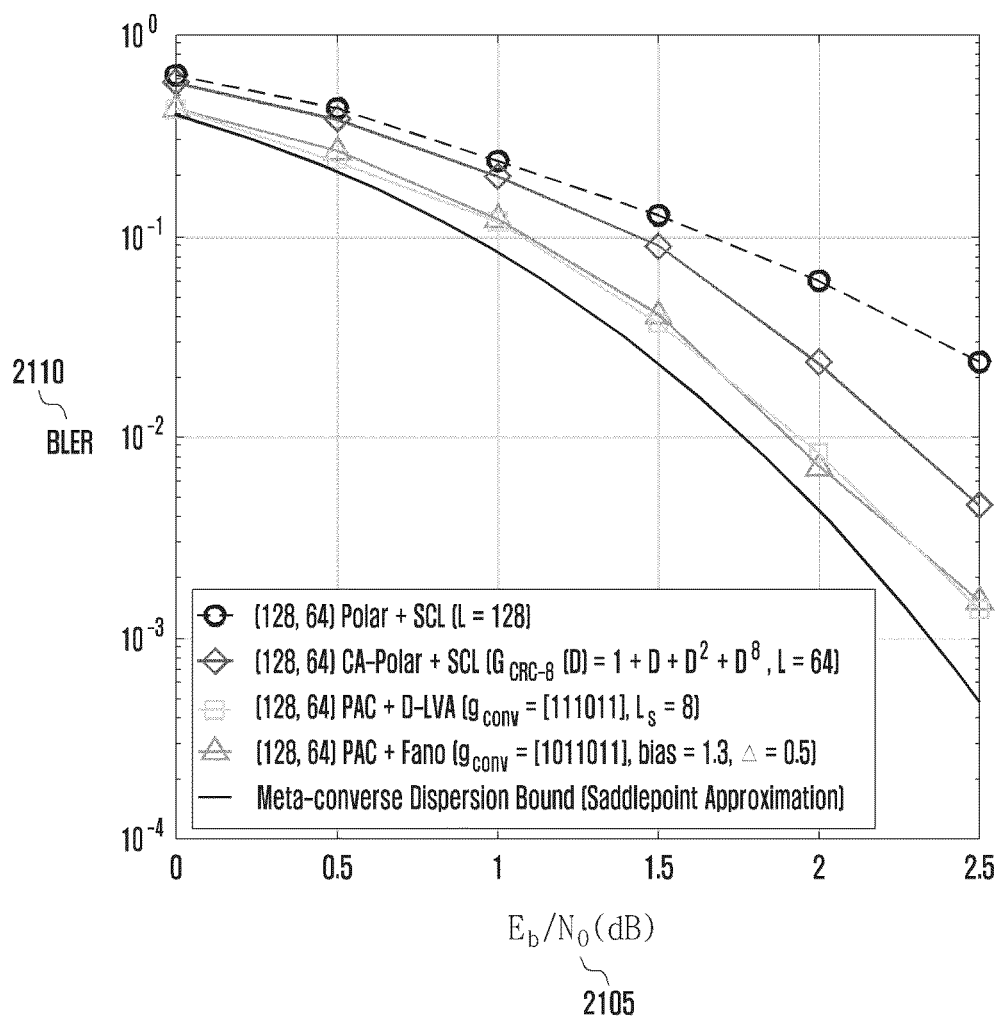
FIG. 21 illustrates a result of simulation for block error rate (BLER) performance comparison according to an embodiment.

FIG. 21 illustrates a result of simulation for BLER performance comparison according to an embodiment.

Referring to FIG. 21, the horizontal axis represents an energy per bit to noise power spectral density ratio ($E_b/N_0$) 2105, and the vertical axis represents a BLER 2110. BLER performances are illustrated for SCL decoding for polar codes, SCL decoding for CA-Polar codes, D-LVA decoding for PAC codes, and Fano decoding for PAC codes.

Previously, PAC codes under Fano decoding have been described as being superior to CA-polar codes, which is the coding scheme for 5G new radio control channels. FIG. 21 shows that the PAC code under Fano decoding has better BLER performance than that of the polar or CA-polar codes. The PAC code under D-LVA decoding according to an embodiment of the disclosure outperforms the BLER performance of polar or CA-polar codes under SCL decoding by a significant margin while having similar BLER performance to that of the PAC code under Fano decoding. The PAC code under D-LVA decoding according to an embodiment of the disclosure has a BLER performance close to the meta-converse bound, which is a lower limit of BLER in finite block length schemes.

Figure 22:
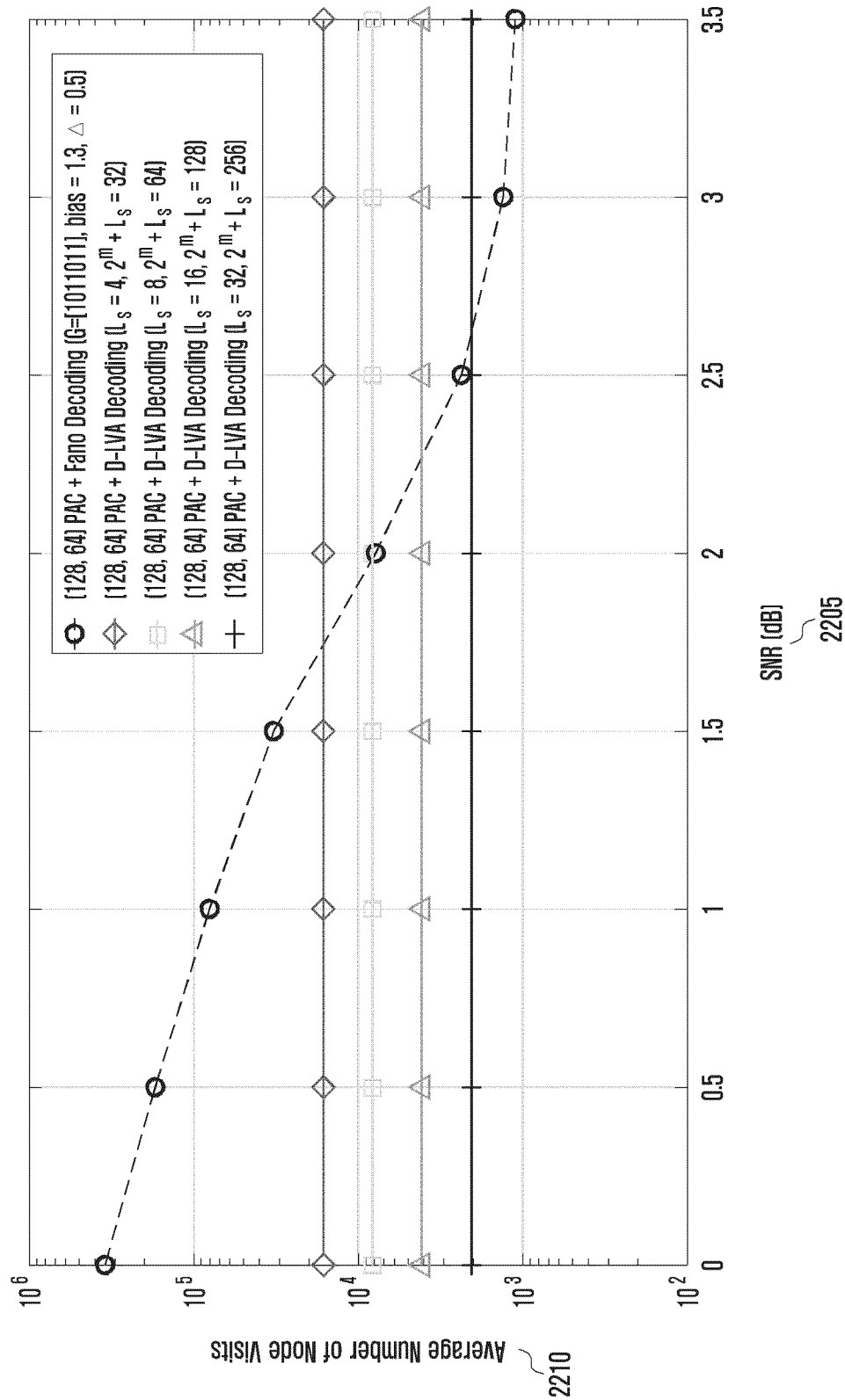
FIG. 22 illustrates an average number of node visits (ANV) according to SNR with respect to Fano decoding and D-LVA decoding according to an embodiment.

FIG. 22 illustrates an ANV according to SNR with respect to Fano decoding and D-LVA decoding according to an embodiment.

As previously described, although the PAC code is a promising channel coding method for the control channel of future wireless networks due to its near-optimal error correction performance under Fano decoding, its backtracking function leads to the possibility of searching the same node sequence multiple times. In particular, the ANV 2210, which is a metric of computational complexity, becomes an SNR (decibel (dB)) 2205-dependent random variable. Referring to FIG. 22, it is evident that the PAC code under Fano decoding has a low ANV value at high SNR but has a very high ANV value as the SNR 2205 decreases. As such, the variable computational complexity under Fano decoding and the resulting variable throughput make it difficult to use the PAC code. However, referring to FIG. 21, it is evident that the PAC code under D-LVA decoding according to an embodiment of the disclosure has a constant ANV value regardless of the SNR.

As described above with reference to FIGS. 21 and 22, the PAC code under D-LVA decoding can provide a constant computational complexity and throughput without having a variable computational complexity and throughput depending on SNR, which is a disadvantage of a PAC code under Fano decoding, while having a good performance almost similar to a PAC code under Fano decoding having optimal error correction performance.

Methods disclosed in the claims and/or methods according to the embodiments described in the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to embodiments of the disclosure.

These programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of these may form a memory in which the program is stored. A plurality of such memories may be included in the electronic device.

Moreover, the programs may be stored in an attachable storage device which may access the electronic device through communication networks such as the Internet, Intranet, local area network (LAN), Wide LAN (WLAN), and storage area network (SAN) or a combination thereof. Such a storage device may access the electronic device via an external port. A separate storage device on the communication network may access a portable electronic device.

Herein, each block of the flowchart illustrations, and combinations of blocks in the flowchart illustrations, can be implemented by computer program instructions. These computer program instructions can be provided to a processor of a general-purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Furthermore, each block in the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality at issue.

While the disclosure has been illustrated and described with reference to various embodiments of the present disclosure, those skilled in the art will understand that various changes can be made in form and detail without departing from the spirit and scope of the present disclosure as defined by the appended claims and their equivalents.

What is claimed is:

1. A receiver of a communication system, the receiver comprising:
   a transceiver configured to receive a signal encoded based on polarization-adjusted convolutional (PAC) coding from a transmitter; and
   a controller configured to:
      calculate branch metrics of branches defined in a trellis associated with the PAC,
      calculate a path metric based on an accumulated sum of the branch metrics,
      determine a path assigned to each state based on the path metric, and
      estimate a codeword based on the determined path,
   wherein a number of paths assigned to each state is dynamically determined according to the number of active states, and
   wherein the active state includes at least one branch.

2. The receiver of claim 1, wherein the controller is further configured to:
   identify the number of active states among all states;
   identify, based on the number of active states, the number of paths assigned to each active state; and
   determine as many paths as the number of paths assigned to each active state, based on the path metric.

3. The receiver of claim 2, wherein in case that all of states are active states, a preconfigured number of paths is assigned to each of all of the states.

4. The receiver of claim 2, wherein in case that at least one state among all states is not an active state, at least one of the active states is assigned a greater number of paths than a preconfigured number.

5. The receiver of claim 1, wherein the signal encoded based on the PAC coding comprises a cyclic redundancy check (CRC) bit.

6. The receiver of claim 5, wherein the controller is further configured to:
   based on the CRC bit, perform a CRC check on multiple paths related to each state; and
   determine a path, for which a result of the CRC check is valid among the multiple paths, as the path assigned to each state.

7. The receiver of claim 6, wherein the CRC check is performed based on only a bit corresponding to a time instance preceding a time instance corresponding to the CRC bit.

8. The receiver of claim 1, wherein all of the initial states are active states.

9. The receiver of claim 8, wherein the controller is further configured to determine a path assigned to each state such that at least one path corresponding to each of different initial states is included in determined paths.

10. The receiver of claim 9, wherein the controller is further configured to estimate the codeword based on a path in which an end state and the initial state are identical.

11. A method performed by a receiver of a communication system, the method comprising:
    receiving a signal encoded based on polarization-adjusted convolutional (PAC) coding from a transmitter;
    calculating branch metrics of branches defined in a trellis associated with the PAC;
    calculating a path metric based on an accumulated sum of the branch metrics;
    determining a path assigned to each state based on the path metric; and
    estimating a codeword based on the determined path,
    wherein a number of paths assigned to each state is dynamically determined according to the number of active states, and
    wherein the active state includes at least one branch.

12. The method of claim 11, wherein determining the path assigned to each state comprises:
    identifying the number of active states among all states;
    identifying, based on the number of active states, the number of paths assigned to each active state; and
    determining as many paths as the number of paths assigned to each active state, based on the path metric.

13. The method of claim 12, wherein in case that all of states are active states, a preconfigured number of paths is assigned to each of all of the states.

14. The method of claim 12, wherein in case that at least one state among all states is not an active state, at least one of the active states is assigned a greater number of paths than a preconfigured number.

15. The method of claim 11, wherein the signal encoded based on the PAC coding comprises a cyclic redundancy check (CRC) bit.

16. The method of claim 15, wherein determining the path assigned to each state comprises:
    performing, based on the CRC bit, a CRC check on multiple paths related to each state; and
    determining a path, for which a result of the CRC check is valid among the multiple paths, as the path assigned to each state.

17. The method of claim 16, wherein the CRC check is performed based on only a bit corresponding to a time instance preceding a time instance corresponding to the CRC bit.

18. The method of claim 11, wherein all of the initial states are active states.

19. The method of claim 18, wherein the path assigned to each state is determined such that at least one path corresponding to each of the different initial states is included in determined paths.

20. The method of claim 19, wherein the codeword is estimated based on a path in which an end state and the initial state are identical.

* * * * *